United States Patent
Endo et al.

(10) Patent No.: US 8,633,475 B2
(45) Date of Patent: Jan. 21, 2014

(54) ORGANIC ELECTROLUMINESCENCE DEVICE AND A METHOD FOR PRODUCING THE DEVICE

(75) Inventors: Jun Endo, Sodegaura (JP); Chishio Hosokawa, Sodegaura (JP)

(73) Assignee: Idemitsu Kosan Co., Ltd., Tokyo (JP)

(*) Notice: Subject to any disclaimer, the term of this patent is extended or adjusted under 35 U.S.C. 154(b) by 78 days.

(21) Appl. No.: 12/894,066

(22) Filed: Sep. 29, 2010

(65) Prior Publication Data

US 2012/0012820 A1 Jan. 19, 2012

(30) Foreign Application Priority Data

Jul. 16, 2010 (JP) .................................. 2010-161273
Aug. 30, 2010 (JP) .................................. 2010-192603

(51) Int. Cl.
*H01L 29/08* (2006.01)

(52) U.S. Cl.
USPC .............. 257/40; 257/E51.018; 257/E51.002; 438/46

(58) Field of Classification Search
USPC ................ 257/40, E51.018, E51.002; 438/46
See application file for complete search history.

(56) References Cited

U.S. PATENT DOCUMENTS

| | | | |
|---|---|---|---|
| 7,919,195 B2* | 4/2011 | Chen et al. | 428/690 |
| 2003/0170491 A1* | 9/2003 | Liao et al. | 428/690 |
| 2005/0173700 A1* | 8/2005 | Liao et al. | 257/40 |
| 2009/0191428 A1* | 7/2009 | Hatwar et al. | 428/690 |
| 2010/0308306 A1* | 12/2010 | Schmid et al. | 257/40 |

FOREIGN PATENT DOCUMENTS

| | | |
|---|---|---|
| JP | 11-329748 | 11/1999 |
| JP | 2004-281371 | 10/2004 |
| JP | 2006-066380 | 3/2006 |
| JP | 2006-173550 | 6/2006 |
| JP | 3933591 | 3/2007 |
| JP | 2010-092741 | 4/2010 |

* cited by examiner

*Primary Examiner* — Kimberly Rizkallah
*Assistant Examiner* — Caleb Henry
(74) *Attorney, Agent, or Firm* — Foley & Lardner LLP

(57) ABSTRACT

An organic electroluminescence device includes: an anode; a cathode opposed to the anode; and a plurality of emitting units including at least a first emitting unit and a second emitting unit. The plurality of emitting units each includes: an emitting layer; and an intermediate unit between the first emitting unit and the second emitting unit. The intermediate unit includes an electron injecting layer, a zinc oxide layer and a hole injecting layer in this sequence from the anode. The electron injecting layer contains an electron donating material and is adjacent to the first emitting unit. The hole injecting layer contains an organic electron accepting material and is adjacent to the second emitting unit.

15 Claims, 5 Drawing Sheets

ORGANIC ELECTROLUMINESCENCE DEVICE AND A METHOD FOR PRODUCING THE DEVICE

The entire disclosure of Japanese Patent Applications No. 2010-161273 filed Jul. 16, 2010, and No. 2010-192603 filed Aug. 30, 2010, are expressly incorporated by reference herein.

TECHNICAL FIELD

The present invention relates to an organic electroluminescence device and a manufacturing method thereof.

BACKGROUND ART

There has been known an organic electroluminescence device (hereinafter, referred to as an "organic EL device") that includes an emitting unit (in which an emitting layer is included) between an anode and a cathode and emits light using exciton energy generated by a recombination of holes and electrons that have been injected into the emitting layer.

Recently, an arrangement of the organic EL device having a plurality of the emitting units laminated via an intermediate unit and connected in series has been studied for improving luminescent efficiency and lifetime of the organic EL device. Such a device arrangement is occasionally called a tandem-type.

The tandem-type organic EL device requires holes and electrons to be supplied from the intermediate unit to the adjacent emitting units. Accordingly, the intermediate unit is required to have a function for generating the holes and the electrons as well as donating the generated holes and electrons to each of the adjacent emitting units.

From such a background, various studies regarding the intermediate unit have been made.

For instance, an intermediate unit of an organic EL device disclosed in Patent Literature 1 (JP-A-11-329748) is provided by inserting a transparent conductive film such as ITO and IZO between an electron injecting layer and a hole injecting layer, and generates and injects charges to the respective emitting units.

Moreover, for instance, the intermediate unit disclosed in Patent Literature 2 (JP-A-2006-66380) is provided by laminating an electron pulling layer for pulling electrons out of an adjacent layer adjacent to the cathode and the electron injecting layer on the electron pulling layer near the anode. First and second emitting units are adjacent to the intermediate unit. A hexaazatriphenylene derivative is used for the electron pulling layer. Alkali metals (e.g., Li and Cs), alkali metal oxides (e.g., $Li_2O$) and the like are used for the electron injecting layer. The intermediate unit supplies holes, which are generated by the electron pulling layer pulling the electrons out of the adjacent layer, to the first emitting unit and supplies the pulled electrons to the second emitting unit via the electron injecting layer. Thus, driving voltage of the organic EL device is reduced.

For instance, a charge generating layer of the organic EL device disclosed in Patent Literature 3 (JP-A-2006-173550) is provided by laminating an interface layer and an intrinsic charge generating layer. An oxide (e.g., $Li_2SiO_3$) containing at least one of an alkali metal and an alkali earth metal is used for the interface layer (intermediate cathode layer). A hexaazatriphenylene derivative and the like which can provide charge injecting efficiency at the same level as $V_2O_5$ are used for the intrinsic charge generating layer. The charge generating layer is stabilized by providing the interface layer and the charge injecting layer in the emitting unit is omitted by providing the intrinsic charge generating layer, which simplifies the layer arrangement.

In addition to the arrangement of the intermediate unit, as disclosed in Patent Literatures 2 and 3, provided by laminating a layer formed of an alkali metal, an alkali metal compound or the like and a layer formed of an organic compound such as the hexaazatriphenylene derivative, an arrangement of the intermediate unit provided by laminating inorganic compounds has been considered.

For instance, an intermediate layer as the intermediate unit of the organic EL device disclosed in Patent Literature 4 (JP-A-2010-92741) is provided by laminating a conductive layer and a hole injecting layer, or by laminating a conductive layer and an electron injecting layer. For the conductive layer, a mixture of ITO and SiO and the like in addition to Au, ZnO, IZO (indium-zinc oxide) and the like are used as an electric conductor having a low specific resistance ($1\times10^5$ $\Omega\cdot$cm or less). For the hole injecting layer, a metal oxide capable of injecting holes (e.g., $WO_3$, $MoO_3$ and a mixture of ZnO and Mo) is used. For the electron injecting layer, a metal oxide capable of injecting electrons (e.g., $Li_2O$ and $Na_2O$) is used. Thus, driving voltage of the organic EL device is reduced by providing the conductive layer having a low specific resistance. A charge injection barrier to the emitting layer adjacent to the intermediate layer is lowered by providing the hole injecting layer or the electron injecting layer reduces, whereby the driving voltage is further reduced.

Patent Literature 5 (JP-A-2004-281371) discloses a linking unit provided by laminating an n-type doped organic layer, interface layer and p-type doped organic layer, in which the interface layer is lead oxide.

Additionally, Patent Literature 6 (JP Patent No. 3933591) discloses an organic EL device including a charge generating layer provided by laminating an electron accepting substance and an electron donating substance as an intermediate unit. A charge transfer complex is formed on an interface between the electron accepting substance and the electron donating substance. When voltage is applied, charge is moved to the emitting unit adjacent to the charge generating layer, which realizes a long lifetime device in a high luminance range.

However, when the intermediate unit disclosed in Patent Literature 1 is employed as the intermediate unit of the tandem-type organic electroluminescence device, transparent conductive films of ITO and IZO are formed by a sputtering process and electron-beam evaporation. However, in the sputtering process, it is considered that a neutral particle and a charged particle of high speed (tens of electron volts (eV) or more) which are derived from generated plasma cause damages to an organic substance, thereby deteriorating the electron injecting layer of the device.

When the intermediate units disclosed in Patent Literatures 2 and 3 are employed, the layer formed of an alkali metal or an alkali metal compound and the layer formed of the hexaazatriphenylene derivative are likely to form a highly resistant layer. Consequently, the device has to be driven at a high voltage and luminescent efficiency thereof is reduced.

Also when the intermediate layer is provided by laminating the inorganic compounds as disclosed in Patent Literature 4, the device has to be driven at a high voltage and luminescent efficiency thereof is reduced.

In Patent Literature 5 in which lead oxide is used as the interface layer, since lead oxide is an oxide having a low melting point, satisfactory drive durability could not be obtained.

When the charge generating layer disclosed in Patent Literature 6 is employed as the intermediate unit, visible light is absorbed by the charge transfer complex, resulting in reduction in luminescent efficiency.

SUMMARY OF THE INVENTION

An object of the invention is to provide a tandem-type organic electroluminescence device exhibiting high luminescent efficiency and a manufacturing method thereof.

Further, an object of the invention is to provide a tandem-type organic electroluminescence device requiring low driving voltage while exhibiting high luminescent efficiency, and a manufacturing method thereof.

An organic electroluminescence device according to an aspect of the invention includes: an anode; a cathode opposed to the anode; and a plurality of emitting units provided between the anode and the cathode and including at least a first emitting unit and a second emitting unit, the plurality of emitting units each including an emitting layer and an intermediate unit between the first emitting unit and the second emitting unit, in which the intermediate unit includes an electron injecting layer, a zinc oxide layer and a hole injecting layer in this sequence from the anode, the electron injecting layer containing an electron donating material and being adjacent to the first emitting unit, and the hole injecting layer containing an organic electron accepting material and being adjacent to the second emitting unit.

In the organic electroluminescence device according to the above aspect of the invention, the organic electron accepting material is preferably an organic compound containing an electron accepting group.

In the organic electroluminescence device according to the above aspect of the invention, the electron donating material is preferably any one of an alkali metal, an alkali metal compound and an organic electron donating material.

In the organic electroluminescence device according to the above aspect of the invention, the electron injecting layer preferably contains an electron transporting material and at least any one of the alkali metal, the alkali metal compound and the organic electron donating material.

In the organic electroluminescence device according to the above aspect of the invention, the first emitting unit preferably includes an electron transporting layer, the electron transporting layer being adjacent to the electron injecting layer and being formed of one or more organic compounds.

In the organic electroluminescence device according to the above aspect of the invention, it is preferable that the emitting layer in the first emitting unit is adjacent to the electron injecting layer and is formed of one or more organic compounds.

In the organic electroluminescence device according to the above aspect of the invention, a thickness of the zinc oxide layer is preferably in a range from 3 nm to 20 nm.

In the organic electroluminescence device according to the above aspect of the invention, the zinc oxide layer and the hole injecting layer are preferably connected to each other.

A manufacturing method of the organic electroluminescence device according to the above aspect of the invention includes forming the zinc oxide layer by an evaporation method.

An organic electroluminescence device according to a still another aspect of the invention includes: an anode; a cathode opposed to the anode; and a plurality of emitting units provided between the anode and the cathode and including at least a first emitting unit and a second emitting unit, the plurality of emitting units each including an emitting layer; and an intermediate unit between the first emitting unit and the second emitting unit, in which the intermediate unit includes an electron injecting layer, a zinc-containing complex oxide layer and a hole injecting layer in this sequence from the anode, and a zinc-containing complex oxide contained in the zinc-containing complex oxide layer contains zinc and an metal element M except for zinc.

In the organic electroluminescence device according to the above aspect of the invention, the zinc-containing complex oxide is preferably represented by a formula (1) below,

$$ZnM_xO_y \quad (1)$$

where: x is an integer of 1 or 2 and y is an integer of 2 to 6.

In the organic electroluminescence device according to the above aspect of the invention, the element M is preferably an element selected from the group consisting of Mo, W, Ti, Al, Sn, Zr and V.

In the organic electroluminescence device according to the above aspect of the invention, it is preferably that the electron injecting layer contains an electron donating material and is adjacent to the first emitting unit, and the hole injecting layer contains an organic electron accepting material and is adjacent to the second emitting unit.

In the organic electroluminescence device according to the above aspect of the invention, the organic electron accepting material is preferably an organic compound containing an electron accepting group.

In the organic electroluminescence device according to the above aspect of the invention, the electron donating material is preferably any one of an alkali metal, an alkali metal compound and an organic electron donating material.

In the organic electroluminescence device according to the above aspect of the invention, the electron injecting layer preferably contains an electron transporting material and at least any one of the alkali metal, the alkali metal compound and the organic electron donating material.

In the organic electroluminescence device according to the above aspect of the invention, it is preferable that the first emitting unit includes an electron transporting layer, the electron transporting layer being adjacent to the electron injecting layer and being formed of one or more organic compounds.

In the organic electroluminescence device according to the above aspect of the invention, the emitting layer in the first emitting unit is preferably adjacent to the electron injecting layer and is formed of one or more organic compounds.

In the organic electroluminescence device according to the above aspect of the invention, a thickness of the zinc-containing complex oxide layer is preferably in a range from 3 nm to 20 nm.

In the organic electroluminescence device according to the above aspect of the invention, the zinc-containing complex oxide layer and the hole injecting layer are preferably connected to each other.

A manufacturing method of the organic electroluminescence device according to the above aspect of the invention includes forming the zinc-containing complex oxide layer by an evaporation method.

The invention provides a tandem-type organic electroluminescence device exhibiting high luminescent efficiency and a manufacturing method thereof.

Further, the organic electroluminescence device including the zinc oxide layer as the intermediate unit according to the invention provides a tandem-type organic electroluminescence device requiring low driving voltage while exhibiting high luminescent efficiency, and a manufacturing method thereof.

DESCRIPTION OF EMBODIMENTS (Arrangement of Organic EL Device)

Arrangement(s) of an organic EL device according to the invention will be described below.

The organic EL device according to the aspect of the invention is provided by laminating a plurality of emitting units via an intermediate unit and is called a tandem-type organic EL device. The number of the emitting units needs to be two or more and may be three or more.

[First Exemplary Embodiment]

The tandem-type organic EL device includes the plurality of emitting units, e.g., a first emitting unit and a second emitting unit, as follows:

anode/first emitting unit/intermediate unit/second emitting unit/cathode.

Figure 1:
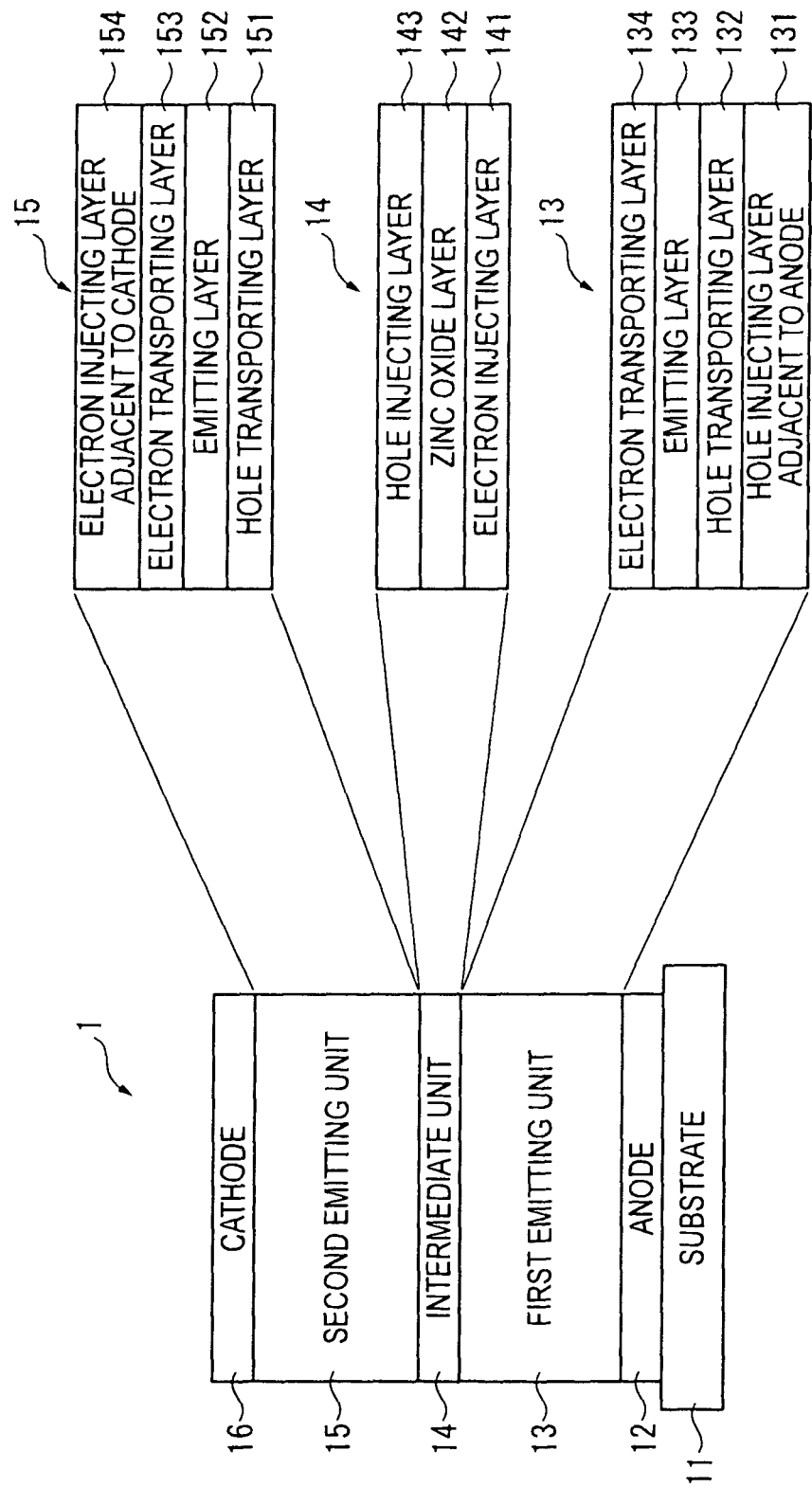
FIG. 1 schematically shows an exemplary arrangement of an organic EL device according to a first exemplary embodiment of the invention.

In the first exemplary embodiment, a tandem-type organic EL device 1 arranged as shown in FIG. 1 is exemplarily described. The organic EL device 1 is provided by laminating an anode 12, a first emitting unit 13, an intermediate unit 14, a second emitting unit 15 and a cathode 16 on a substrate 11 in this sequence. As shown in FIG. 1, the first emitting unit 13, the intermediate unit 14 and the second emitting unit 15 are respectively provided with a plurality of layers. The arrangements thereof are as follows.

The first emitting unit 13:
 a hole injecting layer 131 adjacent to the anode
 a hole transporting layer 132
 an emitting layer 133
 an electron transporting layer 134
The intermediate unit 14:
 an electron injecting layer 141
 a zinc oxide layer 142
 a hole injecting layer 143
The second emitting unit 15:
 a hole transporting layer 151
 an emitting layer 152
 an electron transporting layer 153
 an electron injecting layer 154 adjacent to the cathode The units and the layers each are described in detail below.

(Intermediate Unit)

The intermediate unit supplies electrons to the first emitting unit and supplies holes to the second emitting unit.

The intermediate unit includes the zinc oxide layer, the electron injecting layer disposed on the zinc oxide layer near the anode and the hole injecting layer disposed on the zinc oxide layer near the cathode. The intermediate unit is provided by laminating the electron injecting layer, the zinc oxide layer and the hole injecting layer in this sequence from the anode. A semiconductor layer or the like may be interposed between the electron injecting layer and the zinc oxide layer. Also, a semiconductor layer or the like may be interposed between the hole injecting layer and the zinc oxide layer. Hereinafter, in order to differentiate the electron injecting layer and the hole injecting layer in the intermediate unit from the electron injecting layer and the hole injecting layer in the emitting unit, particularly, the electron injecting layer and the hole injecting layer in the intermediate unit may occasionally be referred to as "the electron injecting layer in the intermediate unit" and "the hole injecting layer in the intermediate unit."

Zinc Oxide (ZnO) Layer

The zinc oxide layer supplies electrons to the first emitting unit via the electron injecting layer and supplies holes to the second emitting unit via the hole injecting layer.

The zinc oxide layer of the invention is substantially formed of zinc oxide and may contain a component that does not affect operation and effects of the invention. In other words, substances (e.g., impure substances) other than zinc oxide may be contained as long as characteristics of zinc oxide are not hampered.

Since the zinc oxide layer can be formed by a resistance-heating or electron-beam vacuum evaporation method, damages on the layers formed of organic compounds (organic compound layers, e.g., the electron injecting layer, the hole injecting layer and the like), which is located adjacent to the zinc oxide layer can be restrained. For instance, in film-formation of the transparent conductive oxides such as ITO on the organic compound layers, a sputtering process is typically required. Consequently, damages on the organic compound layers by plasma are unavoidable.

When the zinc oxide layer is formed by the vacuum evaporation method, the formed film is coarser than a film formed by a sputtering method and the like. Consequently, a reflectivity of the zinc oxide layer is decreased. Herein, the reflectivity of the zinc oxide layer in a visible light region is in a range from 1.6 to 2.0, preferably in a range from 1.6 to 1.8. In contrast, a reflectivity of IZO (indium-zinc oxide), which is used for the transparent conductive film or the like, is in a range from 2.0 to 2.2 in the visible light region. This reflectivity is largely different from the reflectivity of the organic compound layer formed by an evaporation method.

Thus, by forming the zinc oxide layer by the vacuum evaporation method, a difference between the reflectivity of the zinc oxide layer and the reflectivity of the adjacent organic compound layers is lessened, thereby efficiently acquiring light from the first emitting unit and the second emitting unit which sandwich the intermediate unit therebetween.

Specific resistance of the zinc oxide layer at room temperature is in a range from 1 $\Omega \cdot cm$ to $1 \times 10^5$ $\Omega \cdot cm$, preferably in a range from $1 \times 10^2$ $\Omega \cdot cm$ to $1 \times 10^5$ $\Omega \cdot cm$. Leak current can be prevented by this specific resistance. The leak current herein indicates that, when a plurality of organic EL devices are located adjacent to each other, for instance, in a planar direction of the substrate as an emission source of a display panel, a current flows through the intermediate unit into an organic EL device not expected to emit light, resulting in emission of the organic EL device. In contrast, since specific resistance of IZO (indium-zinc oxide) at room temperature is $1 \times 10^{-4}$ $\Omega \cdot cm$ order, the specific resistance of IZO is sufficiently small relative to that of zinc oxide. As a result, leak current is likely to occur.

A thickness of the zinc oxide layer is preferably in a range from 3 nm to 20 nm, more preferably in a range from 3 nm to 10 nm. Leak current can be further prevented within this range.

The zinc oxide layer provided as the intermediate unit can prevent leak current, so that a clear image display is possible, for instance, when the organic EL device is used as the emission source for display.

Hole Injecting Layer in Intermediate Unit

When voltage is applied on the organic EL device, the hole injecting layer in the intermediate unit receives holes from the zinc oxide layer and supplies, the holes to the second emitting unit.

The hole injecting layer in the intermediate unit of the invention contains an organic electron accepting material. The organic electron accepting material is an organic compound including an electron accepting group. Particularly, the organic electron accepting material is preferably a fused aromatic compound including the electron accepting group and a heterocyclic compound. The hole injecting layer in the intermediate unit is preferably formed of the organic compound only.

Examples of the electron accepting group are a nitro group, imino group, cyano group, carbonyl group and halogen group. The hole injecting layer of the intermediate unit supplies the holes to the second emitting unit by accepting the electrons from the second emitting unit adjacent to the electron injecting layer.

Thus, when the hole injecting layer in the intermediate unit is formed of the electron accepting material, the holes are expected to be favorably injected from the zinc oxide layer by a direct connection of the hole injecting layer in the intermediate unit and the zinc oxide layer.

The organic electron accepting material used for the hole injecting layer in the intermediate unit is preferably a compound represented by the following formula (2).

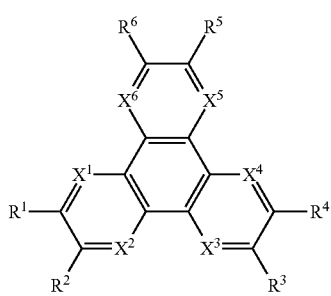

(2)

In the formula (2), $R^1$ to $R^6$ are independently a substituent selected from the group consisting of:
hydrogen;
halogen;
a hydroxyl group;
an amino group;
an arylamino group;
a carbonyl group having 20 or less carbon atoms (which may have a substituent);
a carbonyl ester group having 20 or less carbon atoms (which may have a substituent);
an alkyl group having 20 or less carbon atoms (which may have a substituent);
an alkenyl group having 20 or less carbon atoms (which may have a substituent);
an alkoxyl group having 20 or less carbon atoms (which may have a substituent);
an aryl group having 30 or less carbon atoms (which may have a substituent);
a hetero cyclic group having 30 or less carbon atoms (which may have a substituent);
a nitrile group;
a nitro group;
a cyano group; and
a silyl group.

In the formula (2), among $R^m$ (m=1 to 6), adjacent groups may be bonded to each other through a cyclic structure.

$X^1$ to $X^6$ are independently a carbon atom or a nitrogen atom.

A compound represented by the following formula (2)-1 is preferable among the organic compounds represented by the formula (2).

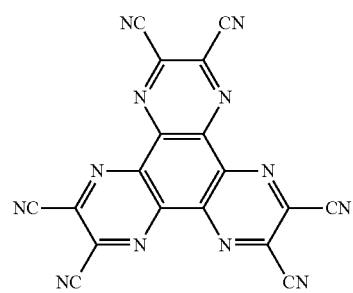

(2)-1

A compound represented by the following formula (3) is also preferably used as the organic electron accepting material used for the hole injecting layer in the intermediate unit.

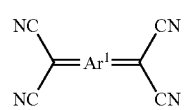

(3)

In the formula (3), $Ar^1$ is an organic group that can be substituted by halogen or CN group. Examples of the organic group are listed below.

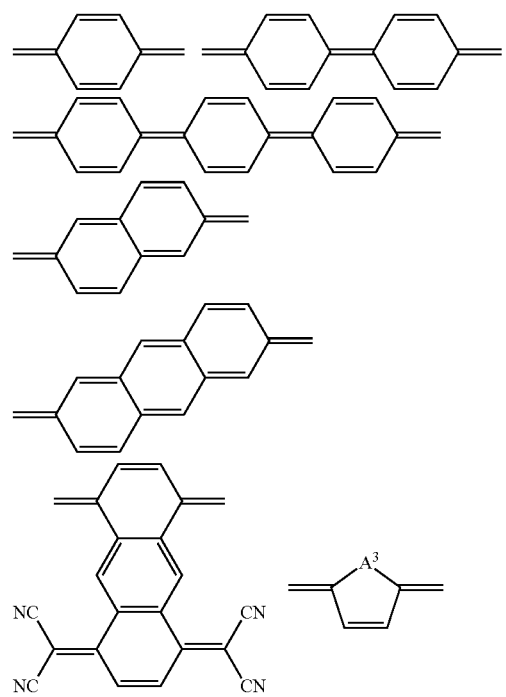

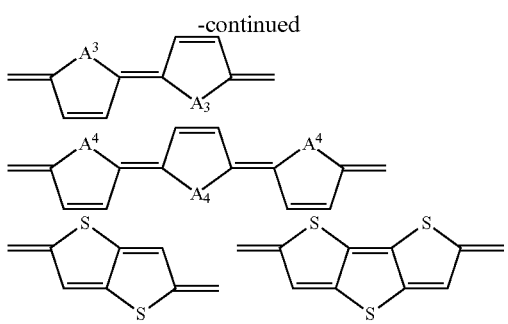

In the organic group, $A^3$ is independently an oxygen atom, a sulfur atom, or a selenium atom.

In the organic group, $A^4$ is independently a sulfur atom or a selenium atom.

Compounds represented by the following formulae (4) to (6) are also preferably used as the organic electron accepting material used as the hole injecting layer in the intermediate unit.

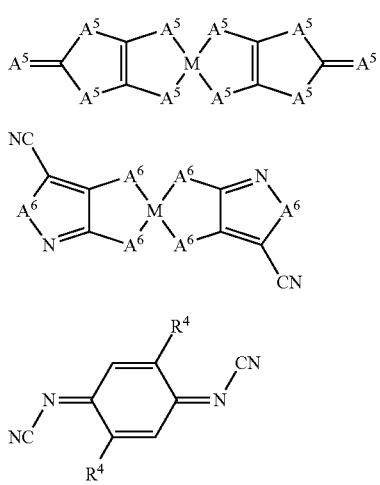

In the formulae (4) to (6), $A^5$ is independently a carbon atom, a sulfur atom, a selenium atom, tellurium atom or oxygen atom.

$A^6$ is independently a carbon atom, a sulfur atom, a selenium atom or tellurium atom.

M is a nickel atom, a palladium atom, a platinum atom, or a zinc atom.

$A^4$ is independently a hydrogen atom, a halogen atom, an alkyl group having 1 to 50 carbon atoms or an alkoxyl group having 1 to 50 carbon atoms.

Specific examples of the compounds represented by the formulae (3) to (6) are the following organic materials and compounds obtained by substituting the organic materials with halogen or CN group.

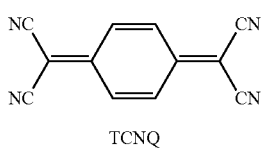

TCNQ

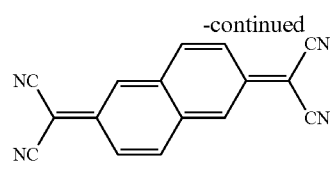

TNAP

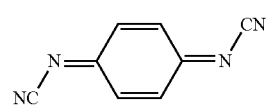

DCNQI

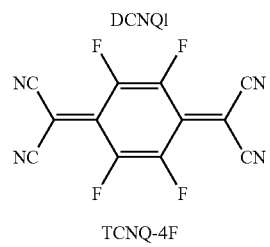

TCNQ-4F

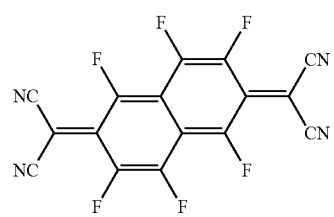

TNAP-4F

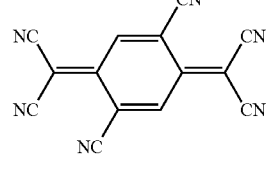

DCTCNQ

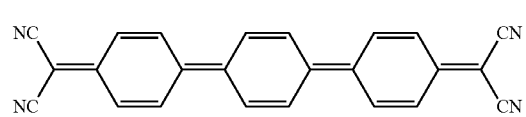

TCNTQ

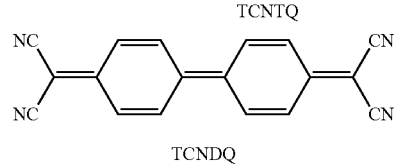

TCNDQ

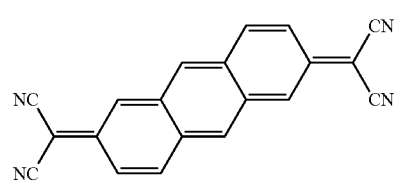

TNAT

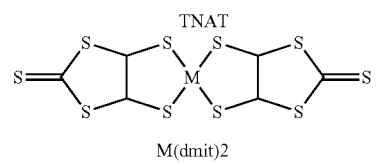

M(dmit)2

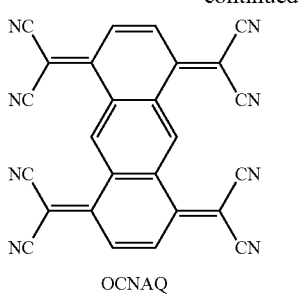

OCNAQ

In addition, as the organic electron accepting material used for the hole injecting layer in the intermediate unit, an indenofluorenedione derivative disclosed in International Publication No. WO 2009/011327, an azaindenofluorenedione derivative disclosed in International Publication No. WO 2009/069717 and an indenofluorenedione derivative disclosed in International Publication No. WO 2010/064655 (PCT/JP2009/070243) are also preferably used. These derivates are shown in the following formula (I).

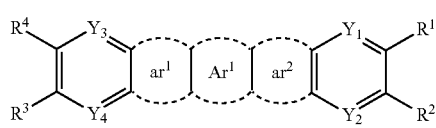
(I)

In the formula (I), $Ar^1$ is a fused ring having 6 to 24 carbon atoms forming the ring or a heterocyclic ring having 6 to 24 atoms forming the ring. $ar^1$ and $ar^2$ may be the same or different from each other. $ar^1$ and $ar^2$ are represented by the following formula (i) or (ii).

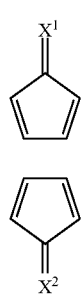

In the formula (i) or (ii), $X^1$ and $X^2$ may be the same or different from each other. $X^1$ and $X^2$ are any one of divalent groups represented by the following formulae (a) to (g).

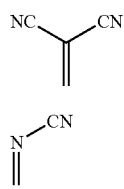

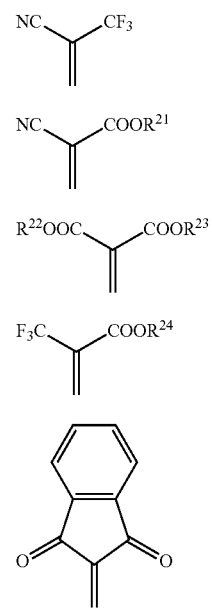

In the formulae (a) to (g), $R^{21}$ to $R^{24}$ may be the same or different from each other. $R^{21}$ to $R^{24}$ represent: a hydrogen atom; a fluoroalkyl group; an alkyl group (which may have a substituent); an aryl group (which may have a substituent); or a heterocyclic group (which may have a substituent). $R^{22}$ and $R^{23}$ may be bonded to each other to form a ring.

In the formula (I), $R^1$ to $R^4$ may be the same or different from each other. $R^1$ to $R^4$ represent: a hydrogen atom; an alkyl group (which may have a substituent); an aryl group (which may have a substituent); a heterocyclic group (which may have a substituent); a halogen atom; a fluoroalkyl group (which may have a substituent); an alkoxyl group; an aryloxy group; or a cyano group. Among $R^1$ to $R^4$, adjacent groups may be bonded to each other to form a ring.

In the formula (I), $Y_1$ to $Y_4$ may be the same or different from each other. $Y_1$ to $Y_4$ are respectively —N—, —CH= or —C($R^5$)=. $R^5$ represents: an alkyl group (which may have a substituent); an aryl group (which may have a substituent); a heterocyclic group (which may have a substituent); a halogen atom; a fluoroalkyl group; an alkoxyl group; an aryloxy group; or a cyano group.

The hole injecting layer in the intermediate unit may contain a hole transporting material in addition to the organic electron accepting material. The hole transporting material is exemplified by an aromatic amine compound, among which an aromatic amine derivative represented by the following general formulae (II) and (III) are preferable.

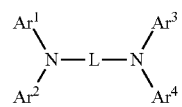
(II)

In the formula (II), $Ar^1$ to $Ar^4$ each represent:
an aromatic hydrocarbon group having 6 to 50 carbon atoms forming a ring (which may have a substituent);
a fused aromatic hydrocarbon group having 6 to 50 carbon atoms forming a ring (which may have a substituent);

an aromatic heterocyclic group having 2 to 40 carbon atoms forming a ring (which may have a substituent);

a fused aromatic heterocyclic group having 2 to 40 carbon atoms forming a ring (which may have a substituent);

a group provided by bonding the aromatic hydrocarbon group and the aromatic heterocyclic group;

a group provided by bonding the aromatic hydrocarbon group and the fused aromatic heterocyclic group;

a group provided by bonding the fused aromatic hydrocarbon group and the aromatic heterocyclic group; or a group provided by bonding the fused aromatic hydrocarbon group and the fused aromatic heterocyclic group.

Aromatic amine represented by the following formula (III) is also preferably used for forming the hole injecting layer or the hole transporting layer.

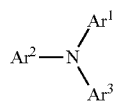

(III)

In the formula (III), $Ar^1$ to $Ar^3$ each represent the same as those represented by $Ar^1$ to $Ar^4$ of the above formula (II).

In order to secure sufficient hole injecting capability and favorably provide emission by optical interference, a thickness of the hole injecting layer in the intermediate unit is preferably in a range from 5 nm to 200 nm, more preferably in a range from 20 nm to 150 nm.

Electron Injecting Layer in Intermediate Unit

When voltage is applied on the organic EL device, the electron injecting layer in the intermediate unit receives electrons from the zinc oxide layer and supplies the electrons to the first emitting unit.

The electron injecting layer in the intermediate unit contains an electron donating material. The electron donating material interacts with another organic material also contained in the electron injecting layer in the intermediate unit, or with an organic material forming a layer adjacent to the electron injecting layer in the intermediate unit, thereby generating radical anions or providing electron-donating radicals.

Specific examples of the electron donating material are an alkali metal, an alkali metal compound, an alkali earth metal, an alkali earth metal compound and an organic electron donating compound.

Examples of the alkali metal are Li, Na, K, Rb, and Cs.

Examples of the alkali metal compound are an alkali metal oxide such as lithium oxide ($Li_2O$) and an alkali metal carbonate such as lithium carbonate ($Li_2CO_3$).

Examples of the alkali earth metal are Ca, Mg, Ba, and Sr.

Examples of the alkali earth metal compound are an alkali earth metal oxide such as calcium oxide (CaO) and an alkali earth metal carbonate such as calcium carbonate ($CaCO_3$).

Examples of the organic electron donating compound are an organic metal complex including alkali metals such as lithium quinolinolate (Liq) and compounds disclosed in JP-A-2007-314513, JP-T-2009-530836, JP-A-2007-273978, JP-T-2010-510645 and JP-T-2010-510179.

The electron injecting layer in the intermediate unit preferably contains an electron transporting material as well as the electron donating material.

The electron transporting material is preferably a nitrogen-containing ring compound. Examples of the electron transporting material are compounds disclosed in International Publication No. WO 04/080975, JP-A-2007-153778' and JP-A-2001-267080. In addition, known materials used for the electron transporting layer and the electron injecting layer are also listed. For instance, an aromatic heterocyclic compound having one or more heteroatoms in a molecular is listed, among which a nitrogen-containing cyclic derivative is particularly preferable. The nitrogen-containing cyclic derivative is preferably an aromatic ring compound having a nitrogen-containing six-membered or five-membered ring skeleton, or a fused aromatic cyclic compound having a nitrogen-containing six-membered or five-membered ring skeleton. The nitrogen-containing cyclic derivative is preferably a nitrogen-containing cyclic metal chelate complex.

When the electron injecting layer in the intermediate unit contains the electron donating material and the electron transporting material, the electron donating material is preferably an alkali metal.

When the electron injecting layer in the intermediate unit contains only the electron donating material without any electron transporting material, the electron transporting material is preferably provided in the first emitting unit so as to be adjacent to the electron injecting layer in the intermediate unit.

Thus, when the electron injecting layer in the intermediate unit contains the electron transporting material in addition to the electron donating material, the electrons are expected to be favorably injected from the zinc oxide layer by a direct connection of the electron injecting layer in the intermediate unit and the zinc oxide layer. However, the invention does not exclude the following arrangement.

For instance, an alkali metal fluoride such as lithium fluoride (LiF) is usable as the alkali metal compound for the electron injecting layer in the intermediate unit.

When using the alkali metal fluoride, an aluminum (Al) layer is preferably interposed between the electron injecting layer in the intermediate unit and the zinc oxide layer.

In order to supply the electrons to the first emitting unit, a part of the alkali metal needs to be present in a form of an elementary substance, not in a form of a compound, in the electron injecting layer in the intermediate unit. For instance, at the formation of the electron injecting layer in the intermediate unit by the vacuum evaporation method, $Li_2O$, $Li_2CO_3$ or the like is partially decomposed and is present in the electron injecting layer in the intermediate unit as the elementary substance of alkali metals. On the other hand, the alkali metal fluoride such as LiF is not decomposed at the formation of the electron injecting layer in the intermediate unit by the vacuum evaporation method. However, at the formation of the aluminum layer by the vacuum evaporation method, the alkali metal fluoride reacts with aluminum to be partially thermally reduced. Thus, when LiF is used, the elementary substance of alkali metals can be present in the electron injecting layer in the intermediate unit by providing the aluminum layer. With this arrangement, the electrons are expected to be favorably injected from the zinc oxide layer, thereby preventing increase in driving voltage.

When the electron donating material is formed by either the alkali metal or the alkali earth metal, the electron transporting material is preferably contained together with the electron donating material. This is because the alkali metal or the alkali earth metal reacts with zinc oxide to oxidize the alkali metal or the alkali earth metal, thereby inhibiting the electrons from being injected to the first emitting unit. In this case, a mass ratio of the electron donating material and the electron transporting material is preferably 1:1.

In order to secure sufficient hole injecting capability and favorably provide emission by optical interference, a thickness of the electron injecting layer in the intermediate unit is preferably in a range from 5 nm to 150 nm, more preferably in a range from 5 nm to 50 nm.

In the first exemplary embodiment, by including the above-mentioned intermediate unit, the organic EL device exhibits low driving voltage and high luminescent efficiency.

In other words, interposing the zinc oxide layer between the hole injecting layer and the electron injecting layer in the intermediate unit prevents formation of an interface where the organic electron accepting material contained in the hole injecting layer and the material forming the electron injecting layer (the electron donating material) are in contact with each other. As a result, the organic electron accepting material and the electron donating material do not interact with each other, thereby preventing decrease in efficiency.

For instance, when the intermediate unit is provided by $Li_2O$ and electron accepting material, due to coexistence of a strong electron donating substance and a strong electron accepting substance on the interface, interaction is likely to occur to necessitate high voltage and result in short lifetime of the device.

In the intermediate unit, since the hole injecting layer containing the organic electron accepting material is provided on the zinc oxide layer near the cathode, the holes are efficiently injected to the second emitting unit. Further, in the intermediate unit, since the electron injecting layer is provided on the zinc oxide layer near the anode, the electrons are efficiently injected to the first emitting unit. In the emitting layer in the first emitting unit, the holes injected from the anode and the electrons injected from the electron injecting layer in the intermediate unit are efficiently re-combined. In the emitting layer in the second emitting unit, the electrons injected from the cathode and the electrons injected from the hole injecting layer in the intermediate unit are efficiently re-combined. Accordingly, luminescent efficiency of each of the emitting layers is improved, whereby luminescent efficiency of an entirety of the organic EL device is enhanced.

(Substrate)

The substrate supports the anode, the plurality of the emitting units, a plurality of the intermediate units and the cathode. The substrate is preferably a smooth substrate that transmits 50% or more of light in a visible region of 400 nm to 700 nm.

Specific examples of the substrate are a glass plate and a polymer plate.

The glass plate is formed of soda-lime glass, barium/strontium-containing glass, lead glass, aluminosilicate glass, borosilicate glass, barium borosilicate glass, quartz, and the like.

The polymer plate is formed of polycarbonate, acryl, polyethylene terephthalate, polyether sulfide, polysulfone and the like.

(Anode and Cathode)

The anode of the organic EL device serves for injecting holes into the hole injecting layer, the hole transporting layer or the emitting layer. The anode advantageously has a work function of 4.5 eV or more.

Specific examples of a material for the anode are alloys of indium-tin oxide (ITO), tin oxide (NESA), indium zinc oxide, gold, silver, platinum and copper.

The anode can be manufactured by forming a thin film from these anode materials, for instance, on the substrate through methods such as evaporation and sputtering.

When light from the emitting layer is to be emitted through the anode as in this exemplary embodiment, the anode preferably transmits more than 10% of the light in the visible region. Sheet resistance of the anode is preferably several hundreds Ω per square or lower. Although depending on the material of the anode, a thickness of the anode is typically in a range from 10 nm to 1 µm, preferably in a range from 10 to 200 nm.

The cathode of the organic EL device serves for injecting electrons to the electron injecting layer, the electron transporting layer or the emitting layer. The cathode preferably has a low work function.

Specific examples of a material for the cathode are indium, aluminum, magnesium, alloy of magnesium and indium, alloy of magnesium and aluminum, alloy of aluminum and lithium, alloy of aluminum, scandium and lithium and alloy of magnesium and silver.

Similar to the anode, the cathode may be manufactured by forming a thin film on the electron transporting layer or the electron injecting layer through a method such as evaporation. In addition, the light from the emitting layer may be emitted through the cathode. When light from the emitting layer is to be emitted through the cathode, the cathode preferably transmits more than 10% of the light in the visible region.

Sheet resistance of the cathode is preferably several hundreds Ω per square or lower.

Although depending on the material of the cathode, a thickness of the cathode is typically in a range from 10 nm to 1 µm, preferably in a range from 50 to 200 nm.

(First Emitting Unit and Second Emitting Unit)

The first emitting unit and the second emitting unit each include the emitting layer. The first emitting unit and the second emitting unit each may be formed of a single emitting layer, or may be provided by laminating the plurality of the emitting layers. Further, as shown in FIG. 1, a layer may be adjacent to the emitting layer 133 in the first emitting unit 13 and the emitting layer 152 in the second emitting unit 15.

Emitting Layer

The emitting layer, which is formed of known emitting materials such as $Alq_3$, provides a single-color emission such as red, green, blue or yellow emission, and combined-color emission of red, green, blue and yellow emission (e.g., white-color emission).

The emitting layer may be formed by a doping method, according to which an emitting material (dopant material) is doped to a host material. The emitting layer formed by the doping method can efficiently generate excitons from charges injected into the host material. With the exciton energy generated by the excitons being transferred to the dopant material, the dopant material can emit light with high efficiency. Emission colors of the first emitting unit and the second emitting unit may be the same or different from each other.

a. Dopant Material

The dopant material, which is formed of known materials for a dopant material, is selected from a dopant-material generating fluorescent emission and a dopant-material generating phosphorescent emission.

The dopant-material generating fluorescent emission (hereinafter, occasionally referred to as a "fluorescent dopant material") is selected from the group consisting of a fluoranthene derivative, pyrene derivative, aryl acetylene derivative, fluorene derivative, boron complex, perylene derivative, oxadiazole derivative and anthracene derivative. The fluoranthene derivative, pyrene derivative and boron complex are preferable among the above.

The dopant-material generating phosphorescent emission (hereinafter, occasionally referred to as a "phosphorescent dopant material") preferably contains a metal complex. The metal complex preferably includes: a metal atom selected from iridium (Ir), platinum (Pt), osmium (Os), gold (Au), rhenium (Re) and ruthenium (Ru); and a ligand. Particularly, the ligand and the metal atom preferably forms an ortho-metal bond.

The phosphorescent dopant material is preferably a compound containing a metal selected from iridium (Ir), osmium (Os) and platinum (Pt) because such a compound, which exhibits high phosphorescence quantum yield, can further enhance external quantum efficiency of the emitting device. The phosphorescent-emitting material is more preferably a metal complex such as an iridium complex, osmium complex or platinum complex, among which an iridium complex and platinum complex are more preferable and ortho metalation of an iridium complex is the most preferable. The organic metal complex formed of the ligand selected from the group consisting of phenyl quinoline, phenyl isoquinoline, phenyl pyridine, phenyl pyrimidine and phenyl imidazoles is preferable in terms of luminescent efficiency and the like.

b. Host Material

The host material, which is formed of known host materials, is exemplified by an amine derivative, azine derivative and fused polycyclic aromatic derivative.

Examples of the amine derivative are a monoamine compound, diamine compound, triamine compound, tetramine compound and amine compound substituted by a carbazole group.

Examples of the azine derivative are a monoazine derivative, diazine derivative and triazine derivative.

The fused polycyclic aromatic derivative is preferably a fused polycyclic aromatic hydrocarbon having no heterocyclic skeleton. Examples of the fused polycyclic aromatic derivative are the fused polycyclic aromatic hydrocarbon such as naphthalene, anthracene, phenanthrene, chrysene, fluoranthene and triphenylene, or derivatives thereof.

Specific examples of the phosphorescent dopant material contained in the emitting layer are a carbazole derivative, triazoles derivative, oxazole derivative, oxadiazole derivative, imidazoles derivative, polyarylalkane derivative, pyrazoline derivative, pyrazolone derivative, phenylenediamine derivative, arylamine derivative, amino-substituted chalcone derivative, styryl anthracene derivative, fluorenone derivative, hydrazone derivative, stilbene derivative, silazane derivative, aromatic tertiary amine compound, styrylamine compound, aromatic dimethylidene compound, porphyrin compound, anthraquinodimethane derivative, anthrone derivative, diphenylquinone derivative, thiopyrandioxide derivative, carbodiimide derivative, fluorenylidenemethan derivative, distyryl pyrazine derivative, hyterocyclic tetracarboxylic acid anhydride such as naphthaleneperylene, phthalocyanine derivative, various metal complex polysilane compounds typified by a metal complex of 8-quinolinol derivative, and a metal complex having metal phthalocyanine, benzoxazole or benzothiazole as the ligand, poly(N-vinylcarbazole) derivative, aniline copolymer, conductive high molecular weight oligomers such as thiophene oligomer and polythiophene, polymer compounds such as polythiophene derivative, polyphenylene derivative, polyphenylene vinylene derivative and polyfluorene derivative.

One of the host material may be used alone, or two or more thereof may be used in combination.

The emitting layers of the first emitting unit and the second emitting unit may contain a dopant material of the same emission type. Specifically, when the emitting layer of the first emitting unit contains a fluorescent dopant material, the emitting layer of the second emitting unit may contain a fluorescent dopant material. When the emitting layer of the first emitting unit contains a phosphorescent dopant material, the emitting layer of the second emitting unit may contain a phosphorescent dopant material.

Alternatively, the emitting layers of the first emitting unit and the second emitting unit may contain a dopant material of a different emission type. Specifically, when one of the emitting layers contains the fluorescent dopant material, the other of the emitting layers contains the phosphorescent dopant material.

These combinations of the emission types of the dopant materials also apply to a case where three or more emitting units are laminated.

When the electron injecting layer in the intermediate unit and the emitting layer in the emitting unit are adjacent to each other, specifically, when the electron transporting layer is not provided between the emitting layer in the first emitting unit and the electron injecting layer in the intermediate unit, the emitting layer is preferably formed of one or more organic compounds. Formation of the emitting layer by one or more organic compounds indicates that the emitting layer is essentially composed of organic compounds. The organic compounds herein include the organic metal complex.

Hole Transporting Layer and Hole Injecting Layer

The hole transporting layer and the hole injecting layer generally help the holes to be injected to the emitting layer and transport the holes to an emitting region. The hole transporting layer and the hole injecting layer exhibit high hole mobility. In the first emitting unit, at least one of the hole injecting layer and the hole transporting layer is interposed between the emitting layer of the first emitting unit and the anode. In the second emitting unit, at least one of the hole injecting layer and the hole transporting layer is interposed between the hole injecting layer in the intermediate unit and the emitting layer in the second emitting unit.

The term "at least one of the hole injecting layer and the hole transporting layer" indicates that only the hole injecting layer or only the hole transporting layer may be provided; or the hole injecting layer and the hole transporting layer may be provided by lamination. The hole injecting layer in the first emitting unit is referred to as the "hole injecting layer adjacent to the anode" for particularly differentiating from the hole injecting layer in the intermediate unit.

In the organic EL device 1 as shown in FIG. 1, the hole injecting layer 131 adjacent to the anode and the hole transporting layer 132 are provided in the first emitting unit 13 in this sequence from the anode 12.

In the organic EL device 1 as shown in FIG. 1, in the second emitting unit 15, the hole transporting layer 151 is provided between the emitting layer 152 and the hole injecting layer 143 of the intermediate unit 14.

Examples of a material for forming the hole injecting layer adjacent to the anode and the hole transporting layer are a material for forming the hole injecting layer in the intermediate unit and a material for forming the hole transporting layer. Further examples of the material for forming the hole injecting layer adjacent to the anode are a porphyrin compound, aromatic tertiary amine compound, styrylamine compound and the like, and known compounds such as a stilbene derivative, silazane derivative, polysilane copolymer, aniline copolymer, conductive polymer oligomer and the like.

Electron Transporting Layer and Electron Injecting Layer

The electron transporting layer and the electron injecting layer generally help the electrons to be injected to the emitting layer and transport the electrons to the emitting region. The electron transporting layer and the electron injecting layer exhibit high electron mobility. In the first emitting unit, the electron transporting layer is interposed between the emitting layer of the first emitting unit and the electron injecting layer in the intermediate unit. In the second emitting unit, at least one of the electron injecting layer and the electron transporting layer is interposed between the emitting layer and the cathode. The term "at least one of the electron injecting layer and the electron transporting layer" indicates that only the electron injecting layer or only the electron transporting layer may be provided; or the electron injecting layer and the electron transporting layer may be provided by lamination.

The electron injecting layer in the second emitting unit is referred to as the "electron injecting layer adjacent to the cathode" for particularly differentiating from the electron injecting layer in the intermediate unit.

In the organic EL device 1 as shown in FIG. 1, in the first emitting unit 13, the electron transporting layer 134 is provided between the emitting layer 133 and the electron injecting layer 141 of the intermediate unit 14. Herein, the electron transporting layer 134 is in contact with the electron injecting layer 141 in the intermediate unit 14. The electron transporting layer 134 is preferably formed of one or more organic compounds. Formation of the electron transporting layer 134 by one or more organic compounds indicates that the electron transporting layer 134 is essentially composed of organic compounds. Particularly, it is indicated that electron transporting layer do not contain any reduction-causing substance such as the alkali metal, alkali earth metal, rare earth metal, alkali metal complex, alkali earth metal complex, rare earth metal complex, halogenated alkali metal, halogenated alkali earth metal and halogenated alkali rare earth metal. In other words, the electron transporting layer is not a layer containing the above reduction-causing substance (so-called N-doped layer).

In the organic EL device 1 as shown in FIG. 1, the electron transporting layer 153 and the electron injecting layer 154 adjacent to the cathode 16 are provided in the second emitting unit 15 in this sequence from the anode 12.

Examples of a material for forming the electron transporting layer are the above electron transporting materials that may be contained in the electron injecting layer in the intermediate unit.

Examples of a material for forming the electron injecting layer adjacent to the cathode are the above electron donating materials for forming the electron injecting layer in the intermediate unit. Further, the electron injecting layer adjacent to the cathode may contain the organic electron donating materials and the electron transporting material similar to the electron injecting layer in the intermediate unit.

(Layer Thickness)

In the organic EL device, a thickness of each of the emitting layer and the like between the anode and the cathode is not particularly limited except for a thickness of each of the above-mentioned layers to be particularly defined. However, the thickness of each of the emitting layer and the like is typically preferably in a range from several nanometers to 1 μm because an excessively-thinned film is likely to entail defects such as a pin hole while an excessively-thickened film requires application of high voltage and deteriorates efficiency.

(Manufacturing Method of Organic EL Device)

In a manufacturing method of the organic EL device of the invention, the zinc oxide layer in the intermediate unit is formed by the evaporation method. Accordingly, when the zinc oxide layer is formed on the electron injecting layer formed by the organic electron donating compound in advance, damages on the organic electron donating compound in the electron injecting layer can be prevented.

A method for forming the hole injecting layer and the electron injecting layer (i.e., other than the zinc oxide layer) in the intermediate unit, the anode, the cathode, and the emitting unit is not particularly limited. Any typical manufacturing methods for organic EL devices are usable. Specific examples for forming the respective layers on the substrate are a vacuum evaporation method, a casting method, a coating method and a spin coating method.

Moreover, in addition to the casting method, the coating method and the spin coating using a solution, in which the organic material of the layers are dispersed, on a transparent polymer such as polycarbonate, polyurethane, polystyrene, polyarylate and polyester, the respective layers can be formed by simultaneous evaporation with the organic material and the transparent polymer.

[Second Exemplary Embodiment]

Next, a second exemplary embodiment is described below.

In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable.

Figure 2:
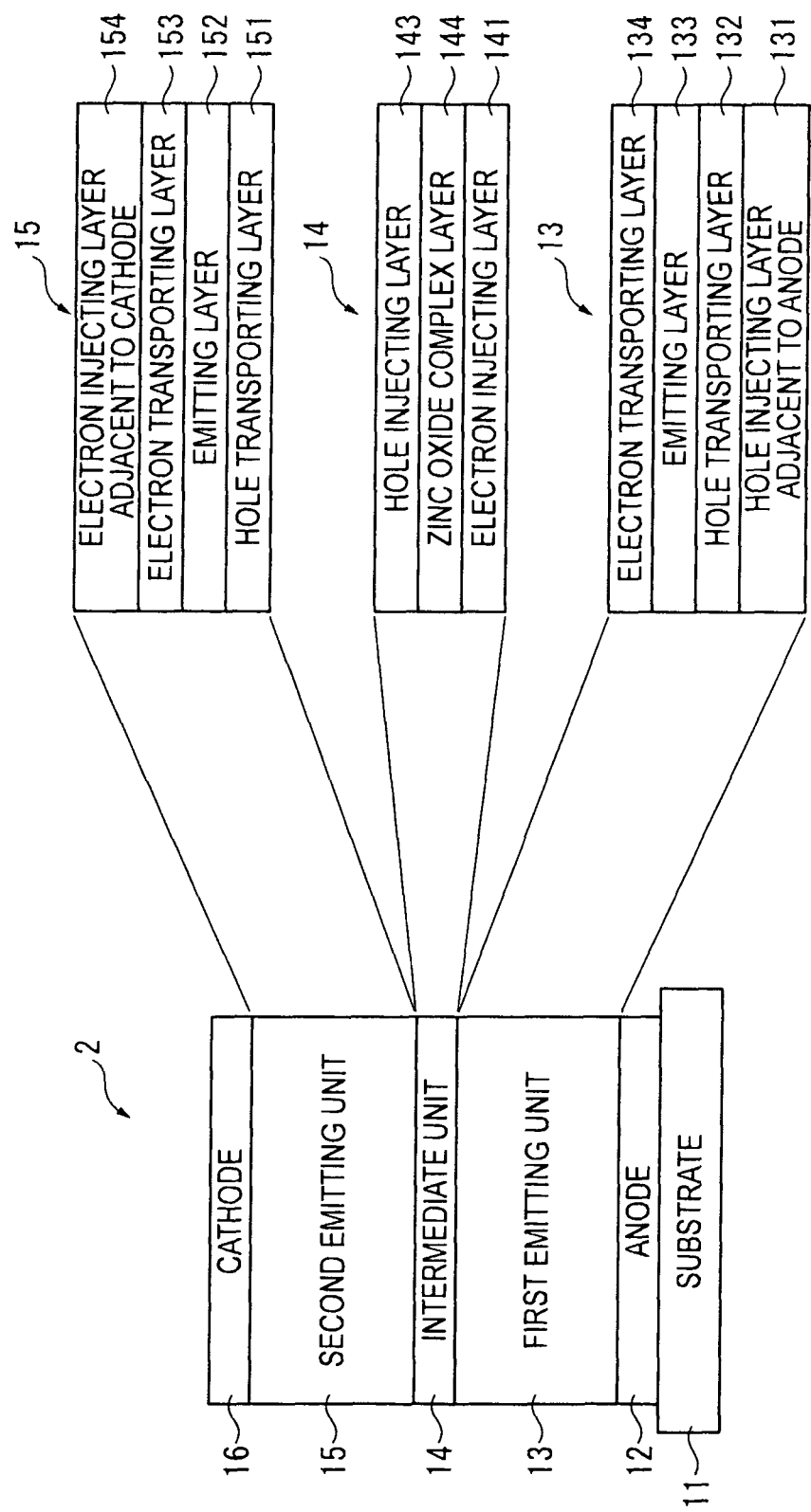
FIG. 2 schematically shows an exemplary arrangement of an organic EL device according to a second exemplary embodiment of the invention.

As shown in FIG. 2, an organic EL device 2 according to the second exemplary embodiment is the same as the organic EL device 1 except that the zinc oxide layer 141 in the intermediate unit 14 of the organic EL device 1 is replaced by a zinc-containing complex oxide layer 144.

(Intermediate Unit)

The intermediate unit supplies electrons to the first emitting unit and supplies holes to the second emitting unit.

The intermediate unit includes the zinc-containing complex oxide layer, the electron injecting layer on the zinc-containing complex oxide layer near the anode and the hole injecting layer on the zinc-containing complex oxide layer near the cathode. The intermediate unit is provided by laminating the electron injecting layer, the zinc-containing complex oxide layer and the hole injecting layer in this sequence from the anode.

Zinc-Containing Complex Oxide ($ZnM_xO_y$) Layer

The zinc-containing complex oxide layer supplies electrons to the first emitting unit via the electron injecting layer and supplies holes to the second emitting unit via the hole injecting layer.

A zinc-containing complex oxide for the zinc-containing complex oxide layer of the invention contains: zinc (Zn); metal forming a complex acid with zinc (Zn); and oxygen at a fixed ratio. The zinc-containing complex oxide is preferably represented by the formula (1). Further, an element M is more preferably selected from the group consisting of Al, Mo, W, Ti, Sn, Zr and V. x and y each are preferably an integer.

Specific examples of the zinc-containing complex oxide are $ZnMoO_4$ (zinc molybdate), $ZnWO_4$ (zinc tungstate), $ZnTiO_3$ (zinc titanate), $ZnAlO_3$ (zinc aluminate), $ZnZrO_3$ (zinc zirconate), $ZnSnO_3$ (zinc stannate) and $ZnV_2O_6$ (zinc vanadate).

The zinc-containing complex oxide layer of the invention is substantially composed of the zinc-containing complex oxide and may contain an element (other than zinc, the element M and oxygen) that does not affect operation and effects of the invention. In other words, the zinc-containing complex oxide layer may also contain substances (e.g., impure substances) other than the zinc-containing complex oxide as long as characteristics of the zinc-containing complex oxide are not hampered.

Even when the zinc-containing complex oxide layer is formed only of the zinc-containing complex oxide, x and y may not be an integer depending on the evaporation processes.

The zinc-containing complex oxide layer can be formed by a resistance-heating or electron-beam evaporation method, which restrains damages on the layers formed of the organic compounds (organic compound layers, e.g., the electron injecting layer, the hole injecting layer and the like) that are located adjacent to the zinc-containing complex oxide layer. For instance, in film-formation of the transparent conductive oxides such as ITO on the organic compound layers, a sputtering process is typically required. Consequently, damages to the organic compound layers by plasma are unavoidable.

Thus, by forming the zinc-containing complex oxide layer by the evaporation method, a difference between a reflectivity of the zinc-containing complex oxide layer and the reflectivity of the adjacent organic compound layers is lessened, thereby effectively acquiring light from the first emitting unit and the second emitting unit sandwiching the intermediate unit therebetween.

Specific resistance of the zinc-containing complex oxide layer at room temperature is in a range from $10^0$ $\Omega \cdot cm$ to $10^5$ $\Omega \cdot cm$, preferably in a range from $10^0$ $\Omega \cdot cm$ to $1 \times 10^2$ $\Omega \cdot cm$.

Leak current can be prevented by this specific resistance. Leak current herein refers to the definition of the leak current described above. Since specific resistance of IZO (indium-zinc oxide) at room temperature is in a range $10^{-4}$ $\Omega \cdot cm$ order, specific resistance of IZO is sufficiently small relative to that of the zinc-containing complex oxide. As a result, leak current is likely to occur to emit light in an unintended region.

A thickness of the zinc-containing complex oxide layer is preferably in a range from 3 nm to 20 nm, more preferably in a range from 3 nm to 10 nm. Leak current can be further prevented within the range.

The zinc-containing complex oxide layer provided as the intermediate unit can prevent leak current, so that a clear image display is possible, for instance, when the organic EL device is used as the emission source for display.

Hole Injecting Layer in Intermediate Unit

When voltage is applied on the organic EL device, the hole injecting layer in the intermediate unit receives the holes from the zinc-containing complex oxide layer and supplies the holes to the second emitting unit. The hole injecting layer in the intermediate unit in the second exemplary embodiment can be arranged in the same manner as the hole injecting layer in the intermediate unit in the first exemplary embodiment.

Also in the second exemplary embodiment, when the hole injecting layer in the intermediate unit is formed of the organic electron accepting material, the hole is expected to be favorably injected from the zinc-containing complex oxide layer by a direct connection of the hole injecting layer in the intermediate unit and the zinc-containing complex oxide layer.

In order to secure sufficient hole injecting capability and favorably provide emission by optical interference, a thickness of the hole injecting layer in the intermediate unit is preferably in a range from 5 nm to 200 nm, more preferably in a range from 20 nm to 150 nm.

Electron Injecting Layer in Intermediate Unit

When voltage is applied on the organic EL device, the electron injecting layer in the intermediate unit receives the electrons from the zinc-containing complex oxide layer and supplies the electrons to the first emitting unit. The electron injecting layer in the intermediate unit in the second exemplary embodiment can be arranged in the same manner as the electron injecting layer in the intermediate unit in the first exemplary embodiment.

Also in the second exemplary embodiment, when the electron injecting layer in the intermediate unit contains the electron transporting material in addition to the electron donating material, the electrons are expected to be favorably injected from the zinc-containing complex oxide layer by a direct connection of the electron injecting layer in the intermediate unit and the zinc-containing complex oxide layer. However, the invention does not exclude the following arrangement.

For instance, an alkali metal fluoride such as lithium fluoride (LiF) is usable as the alkali metal compound for the electron injecting layer in the intermediate unit.

When using the alkali metal fluoride, an aluminum layer, magnesium layer or magnesium alloy layer is preferably interposed between the electron injecting layer and the zinc-containing complex oxide layer in the intermediate unit.

In order to supply the electrons to the first emitting unit, a part of the alkali metal needs to be present in a form of an elementary substance, not in a form of a compound, in the electron injecting layer in the intermediate unit. For instance, at the formation of the electron injecting layer in the intermediate unit by the evaporation method, $Li_2O$, $Li_2CO_3$ or the like is partially decomposed and is present in the electron injecting layer in the intermediate unit as the elementary substance of alkali metals. On the other hand, the alkali metal fluoride such as LiF is not decomposed at the formation of the electron injecting layer in the intermediate unit by the evaporation method. However, at the formation of the aluminum layer, the magnesium layer or the magnesium alloy layer by the evaporation method, the alkali metal fluoride reacts with aluminum, magnesium or the magnesium alloy to be partially thermally reduced. Thus, when using LiF, the elementary substance of alkali metals can be present in the electron injecting layer in the intermediate unit by providing the aluminum layer, the magnesium layer or the magnesium alloy layer. With this arrangement, the electrons are expected to be favorably injected from the zinc-containing complex oxide layer, thereby preventing increase in driving voltage.

When the electron donating material is formed by either the alkali metal or the alkali earth metal, the electron transporting material is preferably contained together with the electron donating material. This is because the alkali metal or the alkali earth metal reacts with the zinc-containing complex oxide to oxidize the alkali metal or the alkali earth metal, thereby inhibiting the electrons from being injected to the first emitting unit. In this case, a mass ratio between the electron donating material and the electron transporting material is preferably in a range from 25:75 to 1:99, more preferably in a range from 10:90 to 1:99.

In the second exemplary embodiment, in order to secure sufficient hole injecting capability and favorably provide emission by optical interference, a thickness of the electron injecting layer in the intermediate unit is preferably in a range from 5 nm to 150 nm, more preferably in a range from 5 nm to 50 nm.

In the second exemplary embodiment, by including the above-mentioned intermediate unit, the organic EL device exhibits high luminescent efficiency.

In other words, interposing the zinc-containing complex oxide layer between the hole injecting layer and the electron injecting layer in the intermediate unit prevents formation of an interface where the organic electron accepting material contained in the hole injecting layer and the material (electron donating material) forming the electron injecting layer are in contact with each other. As a result, the organic electron accepting material and the electron donating material do not interact with each other, thereby preventing decrease in efficiency.

For instance, when the intermediate unit is provided by $Li_2O$ and electron accepting material, due to coexistence of a strong electron donating substance and a strong electron accepting substance on the interface, interaction is likely to occur to cause decrease in luminescent efficiency and short lifetime of the device due to the high-voltaged device.

In the intermediate unit, the hole injecting layer containing the organic electron accepting material is provided on the zinc-containing complex oxide layer near the cathode, the holes are efficiently injected to the second emitting unit. Further, in the intermediate unit, the electron injecting layer is provided on the zinc-containing complex oxide layer near the anode, the electrons are efficiently injected to the first emitting unit. In the emitting layer in the first emitting unit, the holes injected from the anode and the electrons injected from the electron injecting layer in the intermediate unit are efficiently re-combined. In the emitting layer in the second emitting unit, the electrons injected from the cathode and the electrons injected from the hole injecting layer in the intermediate unit are efficiently re-combined. Accordingly, luminescent efficiency of each of the emitting layers is improved, whereby luminescent efficiency of an entirety of the organic EL device is enhanced.

Since the zinc-containing complex oxide layer provided between the hole injecting layer and the electron injecting layer is not Lewis acidic, formation of the amine compound and charge transfer complex in the hole injecting layer adjacent to the zinc-containing complex oxide layer can be prevented. As a result, decrease in luminescent efficiency by absorption of the visible light can be prevented.

(Other Components)

In the second exemplary embodiment, the substrate, anode, cathode, first emitting unit, second emitting unit and the like are arranged similarly to those in the first exemplary embodiment. The thickness of each of the emitting layer and the like is preferably in the same range as that in the first exemplary embodiment.

(Manufacturing Method of Organic EL Device)

In a manufacturing method of the organic EL device of the invention, the zinc-containing complex oxide layer in the intermediate unit is formed by the evaporation method. Accordingly, when the zinc-containing complex oxide layer is formed on the electron injecting layer formed by the organic electron donating compound in advance, damages to the organic electron donating compound in the electron injecting layer can be prevented.

Other components can be manufactured in the same manner as those in the first exemplary embodiment.

[Third Exemplary Embodiment]

Next, a third exemplary embodiment is described below.

In the description of the third exemplary embodiment, the same components as those in the first exemplary embodiment are denoted by the same reference signs and names to simplify or omit an explanation of the components. In the third exemplary embodiment, the same materials and compounds as described in the first exemplary embodiment are usable.

Figure 3:
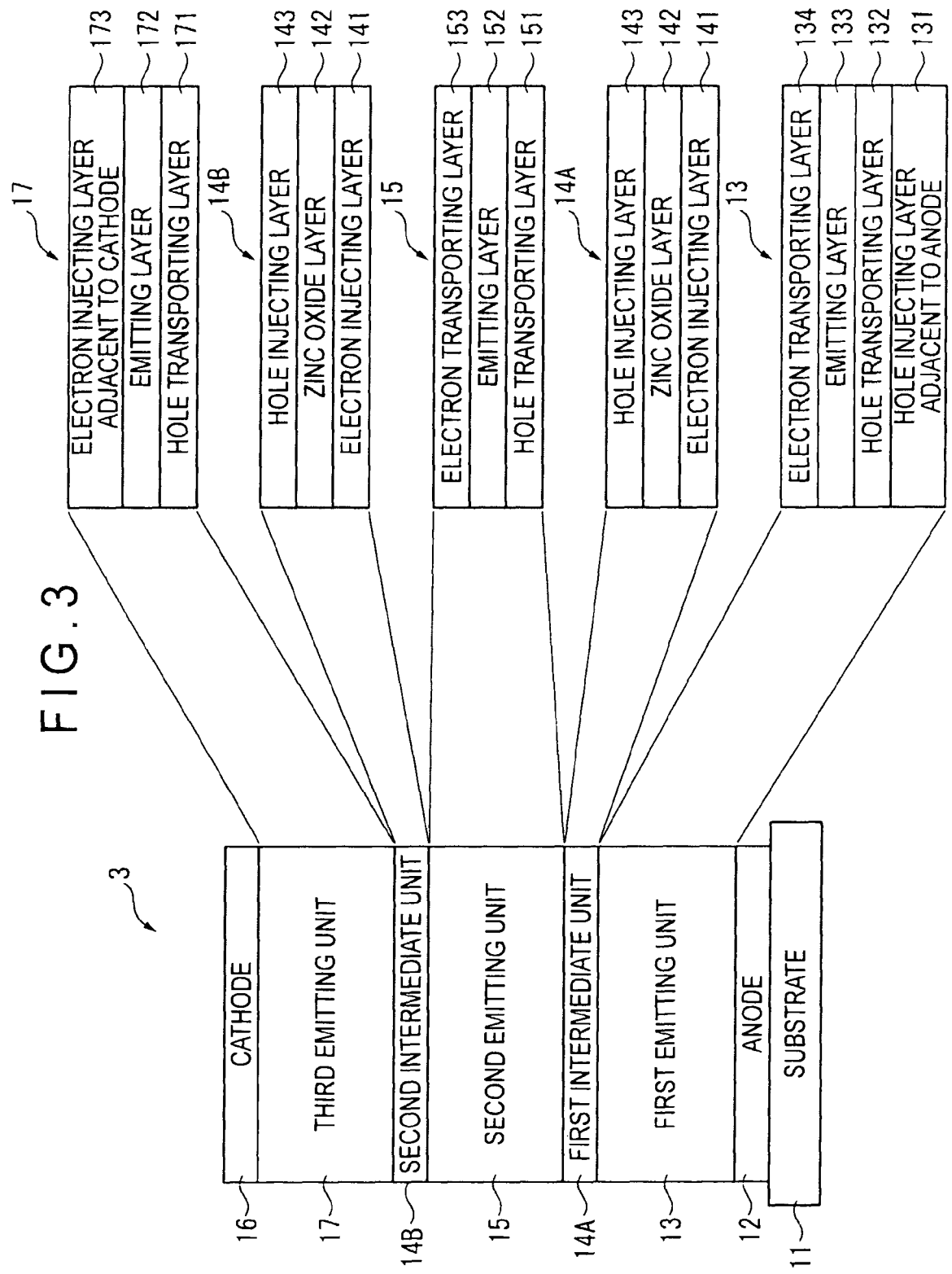
FIG. 3 schematically shows an exemplary arrangement of an organic EL device according to a third exemplary embodiment of the invention.

As shown in FIG. 3, an organic EL device 3 according to the third exemplary embodiment, includes three emitting units and two intermediate units.

The organic EL device 3 is provided by laminating the anode 12, the first emitting unit 13, a first intermediate unit 14A, the second emitting unit 15, a second intermediate unit 14B, a third emitting unit 17 and the cathode 16 on the substrate 11 in this sequence.

The first emitting unit 13 and the second emitting unit 15 in the third exemplary embodiment is essentially the same as those in the first exemplary embodiment and, is provided with the emitting layers and the layers adjacent thereto. The second emitting unit 15 is different from that in the first exemplary embodiment in that no electron injecting layer adjacent to the cathode is provided. In other words, the electron transporting layer 153 of the second emitting unit 15 is adjacent to the electron injecting layer 141 in the second intermediate unit 14B.

The third emitting unit 17 is provided with a plurality of layers below.

the third emitting unit 17:
a hole transporting layer 171
an emitting layer 172
an electron injecting layer 173 adjacent to the cathode These layers of the third emitting unit 17 are provided with the same components as those described in the emitting unit of the first exemplary embodiment. The electron transporting layer may be provided between the electron injecting layer 173 adjacent to the cathode and the emitting layer 172.

The first intermediate unit 14A of the organic EL device 3 supplies electrons to the first emitting unit 13 and supplies holes to the second emitting unit 15. The second intermediate unit 14B supplies electrons to the second emitting unit 15 and supplies holes to the third emitting unit 17. The first intermediate unit 14A and the second intermediate unit 14B are arranged similarly to the intermediate unit 14 according to the first exemplary embodiment.

Since the organic EL device 3 in the third exemplary embodiment is laminated with additional ones of the emitting unit and the intermediate unit as compared to the first exemplary embodiment, the organic EL device 3 exhibits higher luminescent efficiency than the organic EL device 1.

[Fourth Exemplary Embodiment]

Next, a fourth exemplary embodiment is described below.

In the description of the fourth exemplary embodiment, the same components as those in the above exemplary embodiments are denoted by the same reference signs and names to simplify or omit an explanation of the components. In the fourth exemplary embodiment, the same materials and compounds as described in the above exemplary embodiments are usable.

Figure 4:
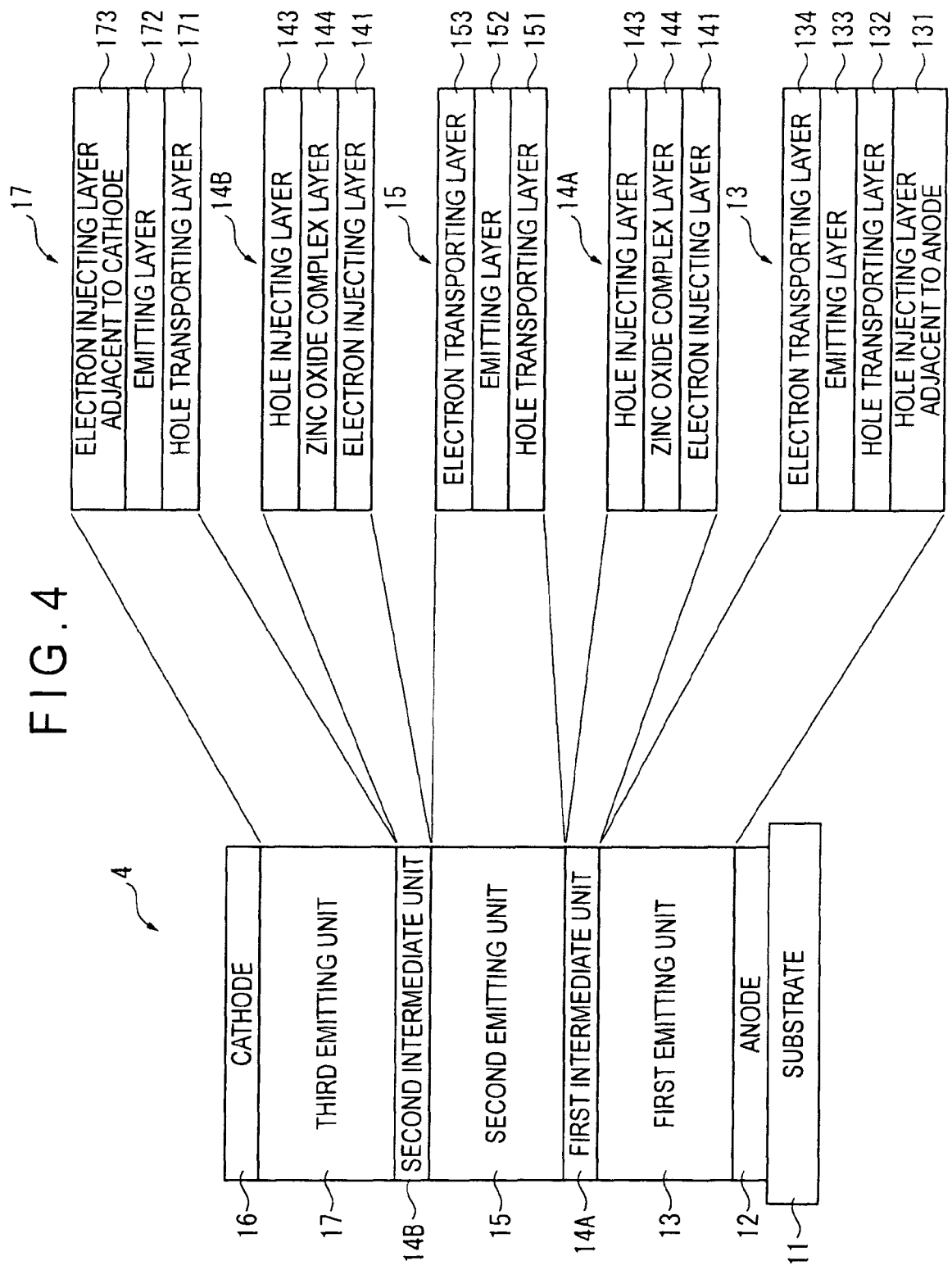
FIG. 4 schematically shows an exemplary arrangement of an organic EL device according to a fourth exemplary embodiment of the invention.

As shown in FIG. 4, an organic EL device 4 according to the fourth exemplary embodiment is the same as the organic EL device 3 except that the zinc oxide layer 141 in the first intermediate unit 14A and the second intermediate unit 14B of the organic EL device 3 according to the third exemplary embodiment is replaced by a zinc-containing complex oxide layer 144 described in the second exemplary embodiment.

Since the organic EL device 4 in the fourth exemplary embodiment is laminated with additional ones of the emitting unit and the intermediate unit as compared to the organic EL device 2 in the second exemplary embodiment, the organic EL device 4 exhibits higher luminescent efficiency than the organic EL device 2.

[Fifth Exemplary Embodiment]

Next, a fifth exemplary embodiment is described below.

In the description of the fifth exemplary embodiment, the same components as those in the above exemplary embodiments are denoted by the same reference signs and names to simplify or omit an explanation of the components. In the fifth exemplary embodiment, the same materials and compounds as described in the above exemplary embodiments are usable.

An organic EL device 5 according to the fifth exemplary embodiment is arranged to be capable of emitting light by three primary colors (RGB): red (R), green (G) and blue (B).

Figure 5:
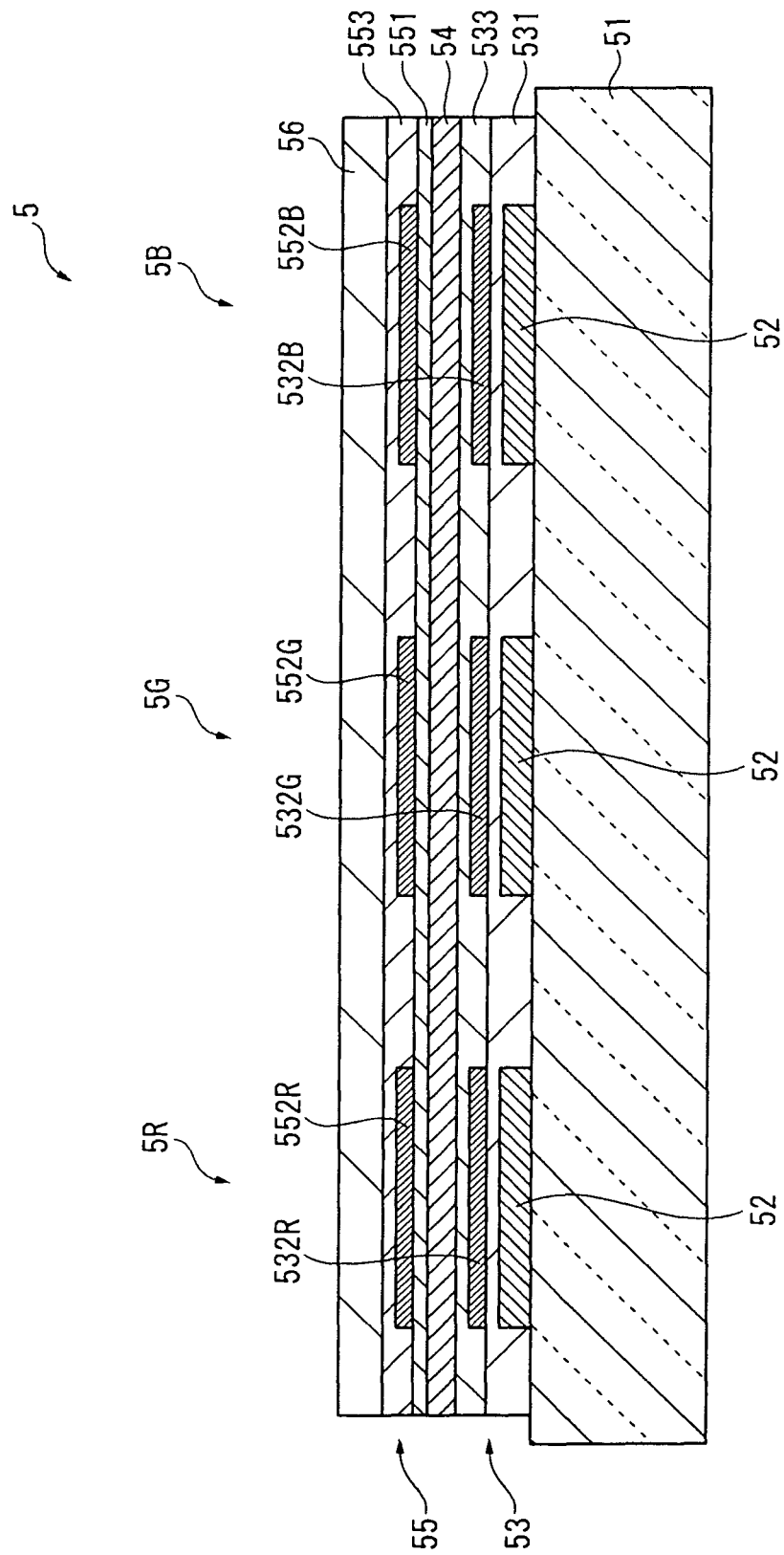
FIG. 5 schematically shows a cross section seen in a thickness direction of a substrate of an organic EL device according to a fifth exemplary embodiment of the invention.

As shown in FIG. 5, a red-emitting portion 5R, a green-emitting portion 5G and a blue-emitting portion 5B are formed on a common substrate 51.

The organic EL device 5 is provided by laminating an anode 52, first emitting unit 53, intermediate unit 54, second emitting unit 55 and cathode 56 on the substrate 51 in this sequence. The first emitting unit 53 and the second emitting unit 55 each include the emitting layers capable of emitting light in each color of RGB as described below. Layers except for the emitting layers are arranged similarly in the red-emitting portion 5R, the green-emitting portion 5G and the blue-emitting portion 5B.

The first emitting unit 53 is provided by laminating a hole injecting/transporting layer 531, emitting layers (a red-emitting layer 532R, a green-emitting layer 532G and a blue-emitting layer 532B) and an electron transporting layer 533 in this sequence from the anode 52.

The hole injecting/transporting layer 531 includes at least one of the hole injecting layer and the hole transporting layer.

The red-emitting layer 532R, the green-emitting layer 532G and the blue-emitting layer 532B are formed on the hole injecting/transporting layer 531 in a partitioned manner. The emitting layers 532R, 532G and 532B are formed of a material suitably selected from the materials of the first exemplary embodiment so as to be capable of emitting red light, green light and blue light respectively.

The electron transporting layer 533 is formed on the emitting layers (the red-emitting layer 532R, the green-emitting layer 532G and the blue-emitting layer 532B).

Thus, the hole injecting/transporting layer 531 and the electron transporting layer 533 are arranged similarly in the red-emitting layer 532R, the green-emitting layer 532G and the blue-emitting layer 532B.

The intermediate unit 54 is interposed between the first emitting unit 53 and the second emitting unit 55 and is arranged similarly in the red-emitting portion 5R, the green-emitting portion 5G and the blue-emitting portion 5B. For the intermediate unit 54, the same arrangement and materials as those described in the first exemplary embodiment are usable. In other words, the intermediate unit 54 also includes the electron injecting layer, the zinc oxide layer and the hole injecting layer.

The second emitting unit 55 is provided by laminating a hole transporting layer 551, emitting layers (a red-emitting layer 552R, a green-emitting layer 552G and a blue-emitting layer 552B) and an electron injection/transporting layer 553 in this sequence from the anode 52.

The hole transporting layer 551 is formed on the intermediate unit 54.

The red-emitting layer 552R, the green-emitting layer 552G and the blue-emitting layer 552B are formed on the hole transporting layer 551 in a partitioned manner. The emitting layers 552R, 552G and 552B are formed of a material suitably selected from the materials of the first exemplary embodiment so as to be capable of emitting red light, green light and blue light respectively. The emitting layers 552R, 552G and 552B of the second emitting unit 55 each are formed at a position corresponding to a position of each of the emitting layers 532R, 532G and 532B in the first emitting unit 53. For instance, as shown in FIG. 5, the emitting layers are formed in a vertically superposed positions in a cross sectional view in a thickness direction of the substrate 51 of the organic EL device 5.

The electron injecting/transporting layer 553 includes at least one of the electron injecting layer and the electron transporting layer. The electron injecting layer herein refers to the electron injecting layer adjacent to the cathode as described in the first exemplary embodiment.

Thus, the hole transporting layer 551 and the electron injecting/transporting layer 553 are arranged similarly in the red-emitting layer 552R, the green-emitting layer 552G and the blue-emitting layer 552B.

Accordingly, the red emitting portion 5R is arranged as follows:

substrate 51/anode 52/hole injecting-transporting layer 531/red-emitting layer 532R/electron transporting layer 533/intermediate unit 54 (electron injecting layer/zinc oxide layer/hole injecting layer)/hole transporting layer 551/red-emitting layer 552R/electron injecting-transporting layer 553/cathode 56.

The green-emitting portion 5G and the blue-emitting portion 5B are respectively provided by replacing the red-emitting layer 532R and 552R of the red-emitting portion 5R with the green-emitting layer 532G and 552G and the blue-emitting layer 532B and 552B.

Thus, the organic EL device 5 includes the emitting portions 5R, 5G and 5B and the intermediate unit 54 whose arrangement and materials are the same as those in the first exemplary embodiment. Accordingly, the emitting portions 5R, 5G and 5B can be driven at low voltage and emit light at high luminescent efficiency. The organic EL device 5 with low voltage drive and high luminescent efficiency is especially useful for color display is particularly useful as an emitting device for a color display and an illumination panel.

Since the intermediate unit 54 includes the zinc oxide layer having an appropriate specific resistance as described above, leak current between the emitting portions 5R, 5G and 5B can be prevented. Consequently, since an unintended emitting portion is prevented from emitting, clear color display is possible, for instance, when the organic EL device 5 is used for the color display.

In the organic EL device 5, a method for forming the emitting layers 532R, 552R, 532G, 552G, 532B and 552B is exemplified by a mask evaporation method, a coating method (ink jetmethod) and a transfer method. Other layers are formed by the methods described in the first exemplary embodiment.

[Sixth Exemplary Embodiment]

Next, a sixth exemplary embodiment is described below.

In the description of the sixth exemplary embodiment, the same components as those in the above exemplary embodiments are denoted by the same names and the like to simplify or omit an explanation of the components. In the sixth exemplary embodiment, the same materials and compounds as described in the above exemplary embodiments are usable.

An organic EL device according to the sixth exemplary embodiment is the same as the organic EL device 5 according to the fifth exemplary embodiment except that the zinc oxide layer 141 in the intermediate unit 14 of the organic EL device 5 is replaced by the zinc-containing complex oxide layer described in the second exemplary embodiment.

The organic EL device according to the sixth exemplary embodiment includes the red-green-blue emitting portions 5R, 5G and 5B, which are the same as the organic EL device 5, and the intermediate unit whose arrangement and materials are the same as those in the second exemplary embodiment. Accordingly, the red-green-blue emitting portions can emit at high luminescent efficiency. The organic EL device according to the sixth exemplary embodiment that exhibits high luminescent efficiency and is capable of color display is particularly useful as an emitting device for a color display and an illumination panel.

Since the intermediate unit according to the sixth exemplary embodiment includes the zinc-containing complex oxide layer having an appropriate specific resistance as described above, leak current between the red-green-blue emitting portions can be prevented. Consequently, since an unintended emitting portion is prevented from emitting, clear color display is possible, for instance, when the organic EL device according to the sixth exemplary embodiment is used for the color display.

In the organic EL device according to the sixth exemplary embodiment, the red-green-blue emitting portions can be formed in the same manner as those in the fifth exemplary embodiment. Other layers are also formed by the methods described in the first exemplary embodiment.

[Modification(s)]

It should be noted that the present invention is not limited to the above description but may include any modification as long as such modification stays within a scope and a spirit of the present invention.

The arrangement of the organic EL device in which two or three emitting units are laminated is described in the above exemplary embodiments, but the arrangement thereof is not limited thereto. Four or more emitting units may be laminated, in which intermediate units are interposed between the emitting units. The number of the emitting units is preferably 2 to 4, more preferably 2 or 3 in view easiness of interference control of light.

In the fifth exemplary embodiment, the organic EL device is arranged with RGB emitting layers that are located in the emitting unit in a partitioned manner, but the arrangement of the organic EL device is not limited thereto. For instance, by providing a white emission of the emitting layer of the emitting unit 33 and 35 and combining separate RGB color filters to the organic EL device 3, an organic EL device capable of RGB emission may be provided. The same description applies to the sixth exemplary embodiment.

EXAMPLES

Next, the invention will be described in further detail by exemplifying Example(s) and Comparative(s). However, the invention is not limited by the description of Example(s).

Example 1

The organic EL device according to Example 1 was manufactured as follows.

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes.

The first emitting unit was formed on the glass substrate.

After the glass substrate having the transparent electrode line was cleaned, the glass substrate was mounted on a substrate holder of a vacuum evaporation apparatus, so that a compound HI was initially formed by resistance heating evaporation onto a surface of the glass substrate where the transparent electrode line was provided so as to cover the transparent electrode. Thus, a 50-nm thick hole injecting layer adjacent to the anode was formed.

A compound HT was laminated on the hole injecting layer by resistance heating evaporation. Thus, a 45-nm thick hole transporting layer was formed.

A compound BH (the host material) and a compound BD (the fluorescent dopant material) were co-evaporated by resistance heating on the hole transporting layer. Thus, a 30-nm thick emitting layer of blue emission was formed. A concentration of the compound BD was 5 mass %.

Thus, the first emitting unit including the hole injecting layer adjacent to the anode, the hole transporting layer and the emitting layer was formed.

Next, the intermediate unit was formed on the first emitting unit.

For formation of the intermediate unit, Li (the electron donating material) and a compound ET (the electron transporting material) were initially co-evaporated by resistance heating on the emitting layer of the first emitting unit. A lithium evaporation source at this time was a lithium dispenser (LI/BD/GR/100×24×6/200) manufactured by SAES getters S.p.A. Thus, a 20-nm thick electron injecting layer was formed. A concentration of Li was 5 mass %.

A 5-nm thick zinc oxide (ZnO) layer was laminated on the electron injecting layer by resistance heating evaporation. A compound HAT (the electron accepting material) was laminated on the zinc oxide layer by resistance heating evaporation. A 10-nm thick hole injecting layer was formed.

Thus, the intermediate unit including the electron injecting layer, the zinc oxide layer and the hole injecting layer was formed.

Next, the second emitting unit was formed on the intermediate unit.

For formation of the second emitting unit, the compound HI was initially laminated by resistance heating evaporation on the hole injecting layer of the intermediate unit. Thus, a 40-nm thick first hole transporting layer was formed.

The compound HT was laminated on the first hole transporting layer by resistance heating evaporation. Thus, a 45-nm thick second hole transporting layer was formed.

The compound BH (the host material) and the compound BD (the fluorescent dopant material) were co-evaporated by resistance heating on the second hole transporting layer. Thus, a 30-nm thick emitting layer of blue emission was formed. A concentration of the compound BD was 5 mass %.

Li (the electron donating material) and the compound ET (the electron transporting material) were co-evaporated by resistance heating on the emitting layer. Thus, a 25-nm thick electron injecting layer adjacent to the cathode was formed. The concentration of Li was 5 mass %.

Thus, the second emitting unit including the first hole transporting layer, the second hole transporting layer, the emitting layer and the electron injecting layer adjacent to the cathode was formed.

Next, metal aluminum (Al) was evaporated on the electron injecting layer adjacent to the cathode in the second emitting unit to form a 100-nm thick cathode.

The organic EL device was manufactured by the above method.

Examples 2 to 13

The organic EL devices in Examples 2 to 12 were manufactured in the same manner as that in the Example 1 except that the intermediate units were arranged with the combinations shown in Table 1.

The organic EL device in Example 13 was the same as that in Example 1 except for a 3-nm thick ZnO to be formed as the zinc oxide layer of the intermediate unit and a 42-nm hole injecting layer of the second emitting unit.

The arrangements of the intermediate units in Examples 1 and 13 and Comparatives 1 to 5 described below are shown in Table 1. Herein, a layer interposed between the hole injecting layer and the electron injecting layer in the intermediate unit may occasionally be referred to as an intermediate layer in Examples for explanation. Specifically, the intermediate layer is the zinc oxide layer in Examples 1 to 13, but may be a layer formed of $In_2O_3$ or may not be provided in Comparatives 1 to 5 described below.

The numerals in parentheses in Table 1 indicate a thickness of each layer (unit: nm).

TABLE 1

|  | Intermediate Unit Arrangement | | |
| --- | --- | --- | --- |
|  | Electron Injecting Layer | Intermediate Layer | Hole Injecting Layer |
| Example 1 | ET:Li | ZnO(5 nm) | HAT |
| Example 2 | ET:Li | ZnO(5 nm) | HA-1 |
| Example 3 | ET:Li | ZnO(5 nm) | HA-2 |
| Example 4 | ET:Li | ZnO(5 nm) | HA-3 |
| Example 5 | BCP:Li | ZnO(5 nm) | HAT |
| Example 6 | BCP:Li | ZnO(5 nm) | HA-1 |
| Example 7 | BCP:Li | ZnO(5 nm) | HA-2 |
| Example 8 | BCP:Li | ZnO(5 nm) | HA-3 |
| Example 9 | BCP:Cs | ZnO(5 nm) | HAT |
| Example 10 | BCP:Cs | ZnO(5 nm) | HA-1 |
| Example 11 | BCP:Cs | ZnO(5 nm) | HA-2 |
| Example 12 | BCP:Cs | ZnO(5 nm) | HA-3 |
| Example 13 | ET:Li | ZnO(3 nm) | HAT |
| Comparative 1 | ET:Li | none | HAT |
| Comparative 2 | ET:Li | ZnO(5 nm) | $WO_3$ |
| Comparative 3 | ET:Li | $In_2O_3$(5 nm) | HAT |
| Comparative 4 | ET:Li | $LiMoO_4$(5 nm) | HAT |
| Comparative 5 | ET:Li | ITO(5 nm) | HAT |

(Comparative 1)
A device was manufactured in the same manner as that in Example 1 except that the zinc oxide layer was not provided in the intermediate unit.

(Comparative 2)
A device was manufactured in the same manner as that in Example 1 except that $WO_3$ was used in place of HAT as the hole injecting layer in the intermediate unit.

(Comparative 3)
A device was manufactured in the same manner as that in Example 1 except that $In_2O_3$ was used in place of ZnO as the intermediate layer in the intermediate unit.

(Comparative 4)
A device was manufactured in the same manner as that in Example 1 except that $LiMoO_4$ was used in place of ZnO as the intermediate layer in the intermediate unit.

(Comparative 5)
A device was manufactured in the same manner as that in Example 1 except that a 5-nm thick ITO was formed by magnetron sputtering in place of ZnO as the intermediate layer in the intermediate unit.

Next, chemical formulae of materials used in Examples 1 and 13, Comparatives 1 to 5 and the following Examples 14 to 22 are described below.

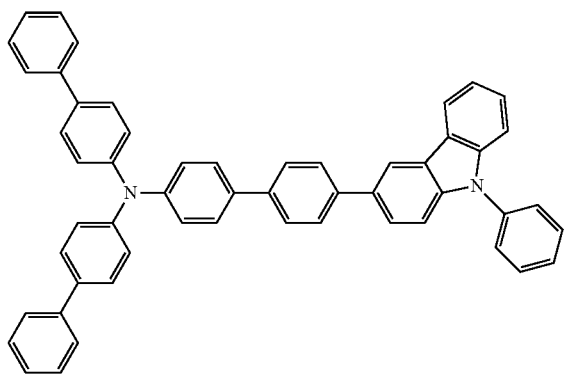

HT

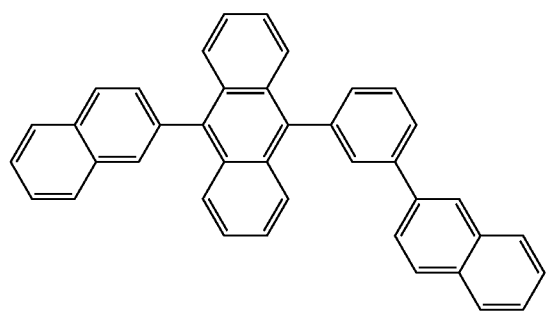

BH

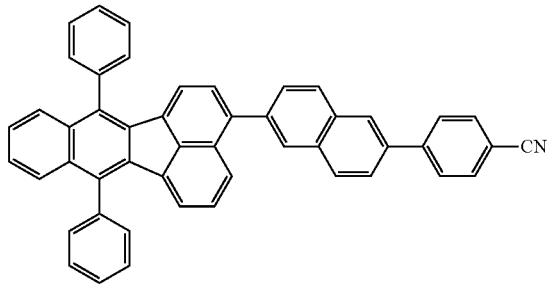

BD

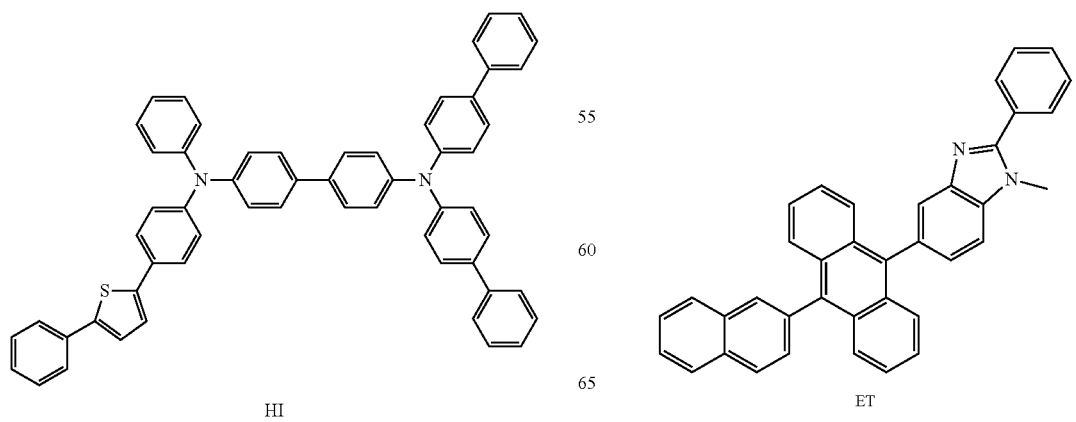

HI

ET

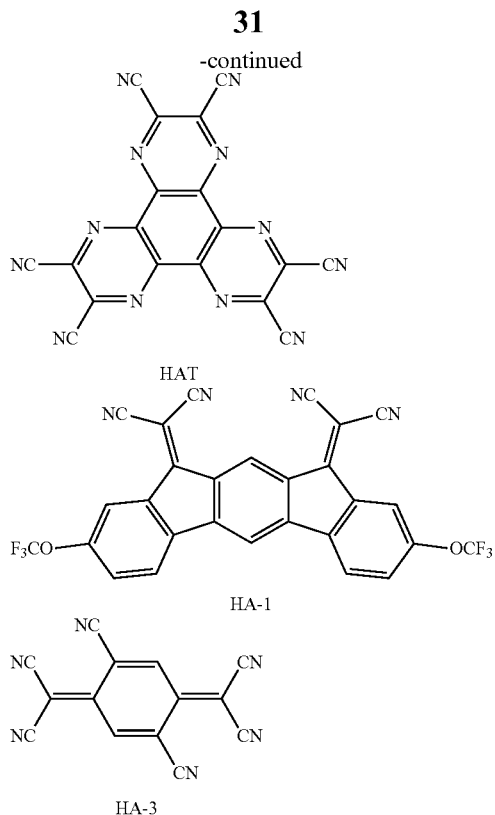

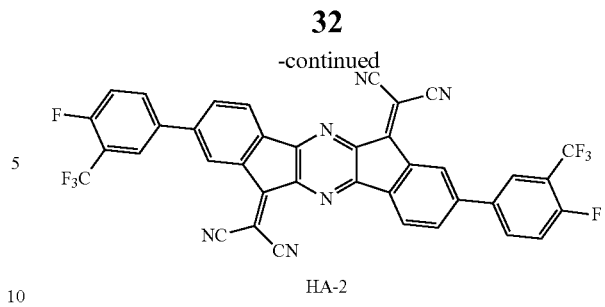

(Evaluation of Organic EL Device)

Next, the organic EL devices according to Examples 1 to 13 and Comparatives 1 to 5 were driven and driving voltages thereof at that time were measured. At this time, voltage was applied relative to the organic EL device so that a current density was 10.00 mA/cm².

EL emission spectrum when the device was driven was measured by a spectroradiometer (CS-1000 manufactured by Konica Minolta Holdings, Inc.). Based on the obtained spectral radiance spectrum, current efficiency (LLD, power efficiency (η) and external quantum efficiency (EQE) were calculated. The results are shown in Table 2. In Table 2, the arrangement of the intermediate unit already shown in Table 1 was shown again for comparing the results.

TABLE 2

| | Intermediate Unit Arrangement | | | | | | External |
|---|---|---|---|---|---|---|---|
| | Electron Injecting Layer | Intermediate Layer | Hole Injecting Layer | Driving Voltage (V) | Current Efficiency (cd/A) | Power Efficiency (lm/W) | Quantum Efficiency (%) |
| Example 1 | ET: Li | ZnO(5 nm) | HAT | 7.1 | 15 | 6.6 | 13.5 |
| Example 2 | ET: Li | ZnO(5 nm) | HA-1 | 6.9 | 15.1 | 6.8 | 13.4 |
| Example 3 | ET: Li | ZnO(5 nm) | HA-2 | 7.3 | 13.3 | 5.8 | 12.2 |
| Example 4 | ET: Li | ZnO(5 nm) | HA-3 | 7.3 | 13.3 | 5.7 | 12.3 |
| Example 5 | BCP: Li | ZnO(5 nm) | HAT | 7.2 | 14.5 | 6.3 | 13.6 |
| Example 6 | BCP: Li | ZnO(5 nm) | HA-1 | 7.1 | 14.5 | 6.4 | 13.3 |
| Example 7 | BCP: Li | ZnO(5 nm) | HA-2 | 7.0 | 13.7 | 6.1 | 12.9 |
| Example 8 | BCP: Li | ZnO(5 nm) | HA-3 | 7.2 | 14.1 | 6.2 | 13 |
| Example 9 | BCP: Cs | ZnO(5 nm) | HAT | 7.3 | 13.6 | 5.8 | 12.9 |
| Example 10 | BCP: Cs | ZnO(5 nm) | HA-1 | 7.2 | 14 | 5.7 | 13.1 |
| Example 11 | BCP: Cs | ZnO(5 nm) | HA-2 | 7.3 | 15.3 | 6 | 13.8 |
| Example 12 | BCP: Cs | ZnO(5 nm) | HA-3 | 7.2 | 15.8 | 6.3 | 14.6 |
| Example 13 | ET: Li | ZnO(3 nm) | HAT | 7.3 | 14.8 | 5.8 | 13.5 |
| Comparative 1 | ET: Li | none | HAT | 7.7 | 10.6 | 4.3 | 8.8 |
| Comparative 2 | ET: Li | ZnO(5 nm) | WO$_3$ | >20 | — | — | — |
| Comparative 3 | ET: Li | In$_2$O$_3$(5 nm) | HAT | 17.7 | 5.2 | 0.9 | 4 |
| Comparative 4 | ET: Li | LiMoO$_4$(5 nm) | HAT | 18.2 | 12.5 | 2.2 | 9.3 |
| Comparative 5 | ET: Li | ITO(5 nm) | HAT | 19.5 | 7.8 | 1.2 | 5.9 |

As understood from Table 2, the organic EL devices according to the Examples 1 and 13 can be driven at low voltage and emit light with high luminance and high efficiency. It is speculated that holes and electrons can be efficiently supplied to the emitting unit adjacent to the intermediate unit because the zinc oxide layer is provided in the intermediate unit and the electron injecting layer and the hole injecting layer formed of the above materials sandwich the zinc oxide layer. These organic EL devices are driven at approximately twofold voltage relative to a driving voltage of a single emitting unit.

On the other hand, the driving voltage of the organic EL device in Comparative 1 was increased as compared to those in Examples 1 to 13. In Comparative 1, no zinc oxide layer was provided and the intermediate unit was formed while the electron accepting compound (HAT) and the electron donating compound (Li) were in contact with each other. It is speculated that, when the organic EL device in Comparative 1 was driven, HAT and Li react with each other on the interface between the hole injecting layer and the electron injecting layer to generate a high-resistant layer. In other words, by the reaction between HAT and Li on the interface between the hole injecting layer and the electron injecting layer when the organic EL device in Comparative 1 was driven, a generation ratio between the holes and the electrons (holes:electrons=1: 1) was disrupted and recombination balance therebetween was disrupted to largely decrease the external quantum efficiency.

In the organic EL device of Comparative 2, the hole injecting layer of the intermediate unit was formed of tungsten oxide in place of the organic electron accepting material. It was found that driving voltage of the organic EL device of Comparative 2 sharply increased as compared with that of the organic EL devices of Examples 1 to 13. This result is considered to be attributed to a large energy gap between a conduction band of zinc oxide and a valence band of tungsten oxide by junction of ZnO (an n-type semiconductor) and tungsten oxide (a semiconductor). In contrast, it is considered that rectification by junction was not expressed in Examples 1 to 13 where the organic electron accepting materials were laminated.

In the organic EL device of Comparative 3, indium oxide known as a semiconductor material along with ZnO was used in the intermediate layer of the intermediate unit. The device of Comparative 3 exhibited high driving voltage and low luminescent efficiency. The result is considered to be attributed to no smooth reception of the electrons due to an injection barrier between indium oxide and the electron injecting layer containing the alkali metal. It is also considered that the indium oxide-evaporated film exhibited low luminescent efficiency because a large area of the film was colored.

In the organic EL device of Comparative 4, lithium molybdate was used in the intermediate layer of the intermediate unit. In the organic EL device of Comparative 4, it is considered that specific resistance of lithium molybdate increases resistance of an entirety of the device. The organic EL device of Comparative 4 exhibited luminescent efficiency at the same level as that of Comparative 1.

In the organic EL device of Comparative 5, ITO was used in the intermediate layer of the intermediate unit. The organic EL device of Comparative 5 exhibited high driving voltage and low luminescent efficiency attributed to damages of the organic compound layer caused by the sputtering process.

Example 14

A glass substrate (size: 25 mm×75 mm×1.1 mm thick) having an ITO transparent electrode (manufactured by Asahi Glass Co., Ltd) was ultrasonic-cleaned in isopropyl alcohol for five minutes, and then UV/ozone-cleaned for 30 minutes. After the glass substrate having the transparent electrode line was cleaned, the glass substrate was mounted on a substrate holder of an evaporation apparatus, so that a 50-nm thick film of the compound HI was initially formed on a surface of the glass substrate where the transparent electrode line was provided so as to cover the transparent electrode. The HI film was provided as the hole injecting layer adjacent to the anode.

Next, a 45-nm thick film of the hole transporting compound HT was formed by resistance heating evaporation on the hole injecting layer adjacent to the anode. The HT film was provided as the hole transporting layer.

Further, the compound BH (the host material) and the compound BD (the dopant material) were co-evaporated by resistance heating on the hole transporting layer to form a 30-nm thick co-evaporation film. The concentration of the compound BD was 5 mass %. The co-evaporation film was provided as the emitting layer.

Further, a 5-nm thick film of the electron transporting compound ET was formed on the organic layer by resistance heating evaporation. The ET film was provided as the electron transporting layer.

The unit including the hole injecting layer, the hole transporting layer, the emitting layer and the electron transporting layer was provided as the first emitting unit.

Subsequently, the electron transporting compound ET and lithium were co-evaporated by resistance heating to form a 20-nm thick electron injecting layer. A lithium evaporation source at this time was Lithium Dispenser (LI/BD/GR/100× 24×6/200) manufactured by SAES getters S.p.A. The concentration of Li was 5 mass %.

Next, a 5-nm thick zinc-containing complex oxide layer was formed on the electron injecting layer by resistance heating evaporation after heating zinc molybdate ($ZnMoO_4$) by a tantalum boat.

Further, a 10-nm thick film of the compound HAT was formed on the zinc-containing complex oxide layer by resistance heating evaporation. The HAT film was provided as the hole injecting layer.

The unit including the electron injecting layer, the zinc-containing complex oxide layer and the hole injecting layer was provided as the intermediate unit.

Further, a 40-nm thick film of the compound HI was formed on the hole injecting layer in the intermediate unit by resistance heating evaporation. The HI film was provided as the first hole transporting layer.

A 45-nm thick film of the compound HT was formed on the first hole transporting layer by resistance heating evaporation. The HT film was provided as the second hole transporting layer.

Next, the compound BH (the host material) and the compound BD (the dopant material) were co-evaporated by resistance heating on the second hole transporting layer to form a 30-nm thick co-evaporation film. The concentration of the compound BD was 5 mass %. The co-evaporation film was provided as the emitting layer.

Further, a 20-nm thick film of the electron transporting compound ET was formed on the emitting layer by resistance heating evaporation. The ET film was provided as the electron transporting layer.

Further, the electron transporting compound ET and lithium were co-evaporated by resistance heating on the electron transporting layer to form a 5-nm thick co-evaporation film. The concentration of Li was 5 mass %. The co-evaporation film was provided as the electron injecting layer adjacent to the cathode.

The unit including the first hole transporting layer, the second hole transporting layer, the emitting layer, the electron transporting layer and the electron injecting layer adjacent to the cathode was provided as the second emitting unit.

Finally, metal aluminum (Al) was evaporated on the electron injecting layer adjacent to the cathode in the second emitting unit to form a 100-nm thick cathode.

The tandem-type organic EL device was manufactured by the above method.

Examples 15 to 22

The organic EL devices according to Examples 15 to 22 were manufactured in the same manner as that of the Example 14 except that the intermediate unit was arranged with the combinations shown in Table 3. Herein, a layer interposed between the hole injecting layer and the electron injecting layer in the intermediate unit may occasionally be referred to as an intermediate layer in Examples for explanation.

The numerals in parentheses in Table 3 indicate a thickness of each layer (unit: nm).

With respect to the organic EL devices according to Examples 15 to 22 were evaluated in the same manner as the above. The results are shown in Table 3.

TABLE 3

| | Intermediate Unit | | | Current Efficiency L/J (cd/A) | Power Efficiency η (lm/W) | External Quantum Efficiency EQE (%) |
| --- | --- | --- | --- | --- | --- | --- |
| | Electron Injecting Layer | Intermediate Layer | Hole Injecting Layer | | | |
| Example 14 | ET: Li | ZnMoO$_4$(5 nm) | HAT | 14.4 | 5.8 | 13.3 |
| Example 15 | ET: Li | ZnMoO$_4$(5 nm) | HA-1 | 12.7 | 5.7 | 13.0 |
| Example 16 | ET: Li | ZnMoO$_4$(5 nm) | HA-2 | 14.5 | 6.4 | 13.7 |
| Example 17 | ET: Li | ZnMoO$_4$(5 nm) | HA-3 | 11.1 | 5.5 | 11.3 |
| Example 18 | ET: Li | ZnWO$_4$(5 nm) | HAT | 15.6 | 6.7 | 13.3 |
| Example 19 | ET: Li | ZnWO$_4$(5 nm) | HA-1 | 15.0 | 6.4 | 12.8 |
| Example 20 | ET: Li | ZnWO$_4$(5 nm) | HA-2 | 13.7 | 6.1 | 12.9 |
| Example 21 | ET: Li | ZnWO$_4$(5 nm) | HA-3 | 13.5 | 6.0 | 12.6 |
| Example 22 | ET: Li | ZnTiO$_3$(5 nm) | HAT | 14.6 | 5.2 | 12.4 |

As understood from Table 3, the organic EL devices according to the Examples 14 to 22 exhibited excellent current efficiency, power efficiency and external quantum efficiency. It is speculated that the holes and the electrons can be efficiently supplied to the emitting unit adjacent to the intermediate unit to enhance the luminescent efficiency because the zinc-containing complex oxide layer is provided in the intermediate unit and the electron injecting layer and the hole injecting layer formed of the above materials sandwich the zinc-containing complex oxide layer.

The invention claimed is:

1. An organic electroluminescence device comprising:
an anode;
a cathode opposed to the anode;
a plurality of emitting units provided between the anode and the cathode and comprising at least a first emitting unit and a second emitting unit, the plurality of emitting units each comprising an emitting layer; and
an intermediate unit between the first emitting unit and the second emitting unit, wherein
the intermediate unit comprises an electron injecting layer, a zinc-containing complex oxide layer and a hole injecting layer in this sequence from the anode;
a zinc-containing complex oxide contained in the zinc-containing complex oxide layer comprises zinc and an metal element M except for zinc;
the zinc-containing complex oxide is represented by a formula (1) below, $$ZnM_xO_y \quad (1)$$

where: x is an integer of 1 or 2 and y is an integer of 2 to 6, and the metal element M is selected from the group consisting of Mo, W, Ti, Al, Zr, and V.

2. The organic electroluminescence device according to claim 1, wherein
the electron injecting layer comprises an electron donating material and is adjacent to the first emitting unit, and
the hole injecting layer comprises an organic electron accepting material and is adjacent to the second emitting unit.

3. The organic electroluminescence device according to claim 2, wherein
the organic electron accepting material is an organic compound comprising an electron accepting group.

4. The organic electroluminescence device according to claim 2, wherein
the electron donating material is any one of an alkali metal, an alkali metal compound and an organic electron donating material.

5. The organic electroluminescence device according to claim 4, wherein
the electron injecting layer comprises an electron transporting material and at least any one of the alkali metal, the alkali metal compound and the organic electron donating material.

6. The organic electroluminescence device according to claim 1, wherein
the first emitting unit comprises an electron transporting layer, the electron transporting layer being adjacent to the electron injecting layer and being formed of one or more organic compounds.

7. The organic electroluminescence device according to claim 1, wherein
the emitting layer in the first emitting unit is adjacent to the electron injecting layer and is formed of one or more organic compounds.

8. The organic electroluminescence device according to claim 1, wherein
a thickness of the zinc-containing complex oxide layer is in a range from 3 nm to 20 nm.

9. The organic electroluminescence device according to claim 1, wherein
the zinc-containing complex oxide layer and the hole injecting layer are connected to each other.

10. The organic electroluminescence device according to claim 1, wherein the hole injection layer comprises an organic electron accepting material being represented by a formula (2) below,

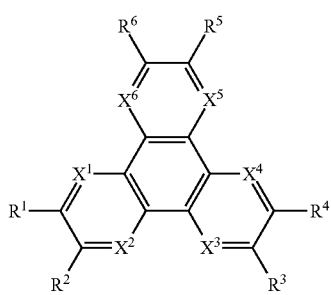

(2)

where $R^1$, $R^2$, $R^3$, $R^4$, $R^5$, and $R^6$ independently represents a substituent selected from the group consisting of:

hydrogen;
halogen;
a hydroxyl group;
an amino group;
arylamino group;
a substituted or unsubstituted carbonyl group having 20 or less carbon atoms;
a substituted or unsubstituted carbonyl ester group having 20 or less carbon atoms;
a substituted or unsubstituted alkyl group having 20 or less carbon atoms;
a substituted or unsubstituted alkenyl group having 20 or less carbon atoms;
a substituted or unsubstituted alkoxyl group having 20 or less carbon atoms;
a substituted or unsubstituted aryl group having 30 or less carbon atoms;
a substituted or unsubstituted helerocyclic group having 30 or less carbon atoms;
a nitrile group;
a nitro;
a cyano group; and
a silyl group,
adjacent ones of $R^1$, $R^2$, $R^3$, $R^4$, $R^5$, and $R^6$ may be bonded to each other through a cyclic structure, and
$X^1$, $X^2$, $X^3$, $X^4$, $X^5$, and $X^6$ are independently a carbon atom or a nitrogen atom.

11. The organic electroluminescence device according to claim 1, wherein the hole injecting layer comprises an organic electron accepting material being represented by a formula (3) below,

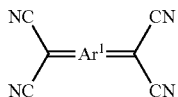

(3)

where $Ar^1$ is an organic group that can be substituted by a halogen or CN group, the organic group being selected from the group consisting of organic groups listed below,

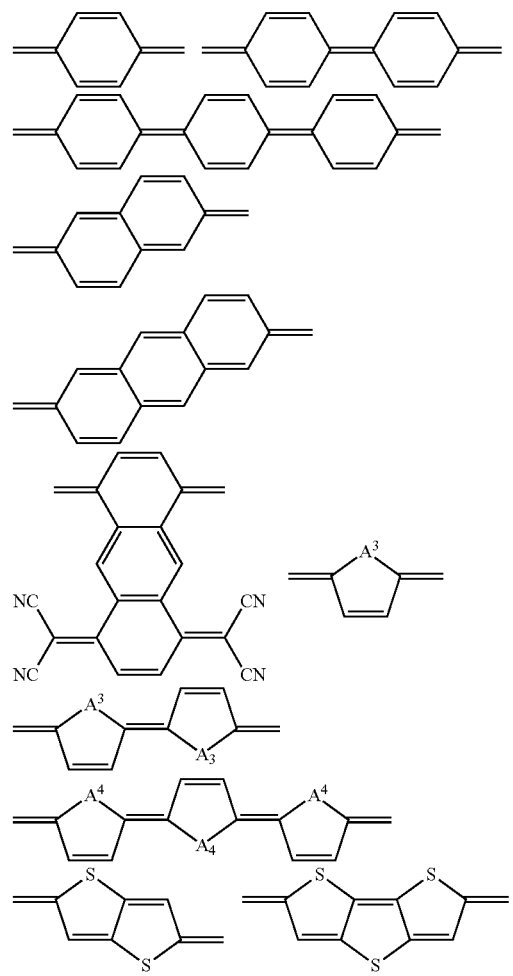

where $A^3$ is independently an oxygen atom, a sulfur atom, or a selenium atom and $A^4$ is independently a sulfur atom or a selenium atom.

12. The organic electroluminescence device according to claim 1, wherein the hole injecting layer comprises an organic electron accepting material being represented by a formula (4) below,

(4)

wherein $A^5$ is independently a carbon atom, a sulfur atom, a selenium atom, a tellurium atom or an oxygen atom, and M is a nickel atom, a palladium atom, a platinum atom, or a zinc atom.

13. The organic electroluminescence device according to claim 1, wherein the hole injecting layer comprises an organic electron accepting material being represented by a formula (5) below,

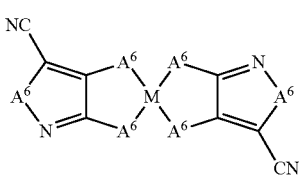
(5)

where $A^5$ is independently a carbon atom, a sulfur atom, a selenium atom or tellurium atom, and M is a nickel atom, a palladium atom, a platinum atom, or a zinc atom.

14. The organic electroluminescence device according to claim 1
wherein
the hole injecting layer comprises an organic electron accepting material being represented by a formula (6) below,

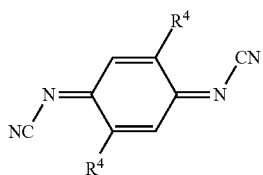
(6)

wherein $R^4$ is independently a hydrogen atom, a halogen atom, an alkyl group having 1 to 50 carbon atoms or an alkoxyl group having 1 to 50 carbon atoms.

15. The organic electroluminescence device according to claim 1
wherein
the hole injecting layer comprised an organic electron accepting material being represented by a formula (I) below,

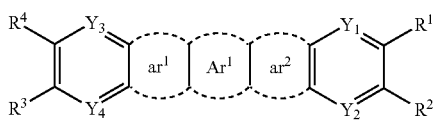
(I)

where $Ar^1$ is a fused ring having 6 to 24 carbon atoms forming the ring or a heterocyclinc ring having 6 to 24 atoms foring the ring and $ar^1$ and $ar^2$ may be the same of different from each other, $ar^1$ and $ar^2$ being represented by a formula (i) or (ii) below,

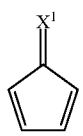
(i)

(ii)

where $X^1$ and $X^2$ may be the same or different from each other, $X^1$ and $X^2$ being one of divalent groups represented by formulae (a) to (g) below,

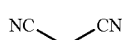
(a)

(b)

(c)

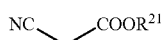
(d)

(e)

(f)

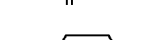
(g)

where $R^{21}$, $R^{22}$, $R^{23}$ and $R^{24}$ may be the same or different from each other, $R^{21}$, $R^{22}$, $R^{23}$ and $R^{24}$ representing:
a hydrogen atom;
a fluoroalkyl group;
a substituted or unsubstituted alkyl group;
a substituted or unsubstituted alkyl group; or
a substituted or unsubstituted heterocyclic group, wherein $R^{22}$ and $R^{23}$ may be bonded to each other to form a ring,
where $R^1$, $R^2$, $R^3$ and $R^4$ in the formula (I) may be the same or different from each other, $R^1$, $R^2$, $R^3$ and $R^4$ representing:
a hydrogen atom;
a substituted or unsubstituted alkyl group;
a substituted or unsubstituted aryl group; or
a substituted or unsubstituted heterocyclic group;
a halogen atom;
a substituted or unsubstituted fluoralkyl group;
an aryloxy; or
a cyano group, wherein adjacent ones of $R^1$, $R^2$, $R^3$ and $R^4$ may be bonded to each other to form a ring,
where $Y^1$, $Y^2$, $Y^3$ and $Y^4$ and in the formula (I) may be the same of different from each other, each of $Y^1$, $Y^2$, $Y^3$ and $Y^4$ being one of —N—, —CH= or —C($R_5$)=, and
where $R^5$ represents:
a substituted or unsubstituted alkyl group;
a substituted or unsubstituted aryl group; or
a substituted or unsubstituted heterocyclic group;
a halogen atom;
a fluoralkyl group;
an alkoxyl group;
an aryloxy group; or
a cyano group.

* * * * *